US010811521B2

(12) United States Patent
Yamazaki et al.

(10) Patent No.: US 10,811,521 B2
(45) Date of Patent: Oct. 20, 2020

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Kenichi Okazaki, Tochigi (JP); Junichi Koezuka, Tochigi (JP); Toshinari Sasaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 330 days.

(21) Appl. No.: 15/292,243

(22) Filed: Oct. 13, 2016

(65) Prior Publication Data

US 2017/0033205 A1    Feb. 2, 2017

Related U.S. Application Data

(62) Division of application No. 13/924,757, filed on Jun. 24, 2013, now Pat. No. 9,472,682.

(30) Foreign Application Priority Data

Jun. 29, 2012 (JP) ................................ 2012-147633

(51) Int. Cl.
*H01L 29/78* (2006.01)
*H01L 29/66* (2006.01)
(Continued)

(52) U.S. Cl.
CPC .... *H01L 29/66969* (2013.01); *H01L 21/0217* (2013.01); *H01L 21/441* (2013.01);
(Continued)

(58) Field of Classification Search
CPC ............. H01L 27/1214; H01L 27/1251; H01L 27/3248; H01L 27/3251; H01L 27/3258;
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    101582453 A    11/2009
EP       1737044 A    12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Moin M Rahman
(74) *Attorney, Agent, or Firm* — Fish & Richardson P.C.

(57) ABSTRACT

In a top-gate transistor in which an oxide semiconductor film, a gate insulating film, a gate electrode layer, and a silicon nitride film are stacked in this order and the oxide semiconductor film includes a channel formation region, nitrogen is added to regions of part of the oxide semiconductor film and the regions become low-resistance regions by forming a silicon nitride film over and in contact with the oxide semiconductor film. A source and drain electrode layers are in contact with the low-resistance regions. A region of the oxide semiconductor film, which does not contact the silicon nitride film (that is, a region overlapping with the gate insulating film and the gate electrode layer) becomes the channel formation region.

9 Claims, 18 Drawing Sheets

(51) Int. Cl.
*H01L 29/786* (2006.01)
*H01L 21/02* (2006.01)
*H01L 21/441* (2006.01)

(52) U.S. Cl.
CPC .... *H01L 29/7869* (2013.01); *H01L 29/78618* (2013.01); *H01L 29/78621* (2013.01); *H01L 29/78693* (2013.01)

(58) Field of Classification Search
CPC ............. H01L 27/3274; H01L 29/4908; H01L 2021/775; H01L 29/66742–6678; H01L 29/786–78696; H01L 27/12–13; H01L 2924/13069; H01L 51/0508–057; H01L 29/04–045; H01L 29/02–365; H01L 29/16–1608; H01L 29/66969; H01L 21/02403; H01L 21/425; H01L 21/477; H01L 29/42384; H01L 29/518; H01L 29/78618; H01L 29/7869; H01L 21/02; H01L 21/02112; H01L 21/28; H01L 29/06; H01L 29/78696
USPC .......... 257/20, 194, 135–136, 213–413, 900, 257/902–903; 438/136, 137, 455–458, 438/149–165, 173, 192, 206, 212, 424, 438/427, 428, 591
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,115,883 B2 | 2/2012 | Yamazaki et al. |
| 8,164,090 B2 | 4/2012 | Iwasaki et al. |
| 8,164,256 B2 | 4/2012 | Sano et al. |
| 8,242,837 B2 | 8/2012 | Yamazaki et al. |
| 8,309,956 B2 | 11/2012 | Arai et al. |
| 8,344,374 B2 | 1/2013 | Yamazaki et al. |
| 8,350,621 B2 | 1/2013 | Yamazaki et al. |
| 8,355,195 B2 | 1/2013 | Sato |
| 8,378,341 B2 | 2/2013 | Hayashi et al. |
| 8,384,076 B2 | 2/2013 | Park et al. |
| 8,445,902 B2 | 5/2013 | Sato et al. |
| 8,488,077 B2 | 7/2013 | Yamazaki et al. |
| 8,502,217 B2 | 8/2013 | Sato et al. |
| 8,513,661 B2 | 8/2013 | Takahashi et al. |
| 8,519,387 B2 | 8/2013 | Endo et al. |
| 8,541,944 B2 | 9/2013 | Sano et al. |
| 8,624,240 B2 | 1/2014 | Sato et al. |
| 8,637,348 B2 | 1/2014 | Endo et al. |
| 8,698,970 B2 | 4/2014 | Yamazaki et al. |
| 8,772,768 B2 | 7/2014 | Yamazaki |
| 8,802,515 B2 | 8/2014 | Endo et al. |
| 8,803,589 B2 | 8/2014 | Yamazaki et al. |
| 8,879,011 B2 | 11/2014 | Yamazaki et al. |
| 8,941,112 B2 | 1/2015 | Yamazaki |
| 8,962,457 B2 | 2/2015 | Watanabe |
| 8,975,115 B2 | 3/2015 | Endo et al. |
| 8,994,889 B2 | 3/2015 | Yamazaki et al. |
| 9,099,498 B2 | 8/2015 | Yamazaki |
| 9,129,937 B2 | 9/2015 | Hayashi et al. |
| 9,209,314 B2 | 12/2015 | Takemura |
| 9,240,488 B2 | 1/2016 | Yamazaki et al. |
| 9,281,412 B2 | 3/2016 | Takemura |
| 9,306,076 B2 | 4/2016 | Yamazaki |
| 9,312,394 B2 | 4/2016 | Hayashi et al. |
| 9,337,321 B2 | 5/2016 | Yamazaki |
| 9,378,980 B2 | 6/2016 | Yamazaki et al. |
| 9,419,020 B2 | 8/2016 | Yamazaki et al. |
| 9,472,683 B2 | 10/2016 | Takemura |
| 9,520,503 B2 | 12/2016 | Yamazaki |
| 9,673,305 B2 | 6/2017 | Endo et al. |
| 9,754,816 B2 | 9/2017 | Hayashi et al. |
| 9,842,859 B2 | 12/2017 | Koyama et al. |
| 2001/0046027 A1 | 11/2001 | Tai et al. |
| 2002/0056838 A1 | 5/2002 | Ogawa |
| 2002/0119648 A1 | 8/2002 | Inoue et al. |
| 2002/0132454 A1 | 9/2002 | Ohtsu et al. |
| 2003/0048395 A1 | 3/2003 | Yasui |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199878 A1* | 9/2005 | Arao ................. H01L 27/1296 257/66 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |

(56) References Cited

U.S. PATENT DOCUMENTS

| | | |
|---|---|---|
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0087587 A1* | 4/2009 | Takahashi ............ C23C 16/345 427/579 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0001272 A1* | 1/2010 | Ye ..................... H01L 21/02521 257/57 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2010/0283049 A1 | 11/2010 | Sato et al. |
| 2011/0042670 A1 | 2/2011 | Sato et al. |
| 2011/0079778 A1 | 4/2011 | Yamazaki et al. |
| 2011/0084267 A1 | 4/2011 | Yamazaki et al. |
| 2011/0101335 A1 | 5/2011 | Yamazaki et al. |
| 2011/0133179 A1* | 6/2011 | Yamazaki .......... H01L 21/3003 257/43 |
| 2011/0168993 A1 | 7/2011 | Jeon et al. |
| 2011/0223765 A1* | 9/2011 | Rajagopalan ........ C23C 16/345 438/694 |
| 2011/0281394 A1 | 11/2011 | Yamazaki |
| 2012/0001167 A1 | 1/2012 | Morosawa |
| 2012/0018727 A1 | 1/2012 | Endo et al. |
| 2012/0032172 A1 | 2/2012 | Noda et al. |
| 2012/0032173 A1 | 2/2012 | Sato et al. |
| 2012/0119212 A1* | 5/2012 | Endo ................ H01L 29/78618 257/57 |
| 2012/0161121 A1 | 6/2012 | Yamazaki |
| 2012/0161124 A1 | 6/2012 | Yamazaki |
| 2012/0161125 A1 | 6/2012 | Yamazaki |
| 2012/0249904 A1 | 10/2012 | Morosawa |
| 2012/0261657 A1* | 10/2012 | Takahashi .......... H01L 29/7869 257/43 |
| 2013/0164920 A1 | 6/2013 | Yamazaki |
| 2013/0221358 A1 | 8/2013 | Morosawa et al. |
| 2013/0256673 A1 | 10/2013 | Nishiyama |
| 2014/0367682 A1 | 12/2014 | Yamazaki et al. |
| 2015/0179675 A1 | 6/2015 | Yamazaki et al. |
| 2015/0303072 A1 | 10/2015 | Yamazaki et al. |
| 2016/0190176 A1 | 6/2016 | Yamazaki et al. |
| 2016/0247939 A1 | 8/2016 | Yamazaki |
| 2016/0293767 A1 | 10/2016 | Yamazaki et al. |
| 2017/0018656 A1 | 1/2017 | Takemura |
| 2017/0069760 A1 | 3/2017 | Yamazaki |
| 2017/0236942 A1 | 8/2017 | Endo et al. |

FOREIGN PATENT DOCUMENTS

| | | |
|---|---|---|
| EP | 2120267 A | 11/2009 |
| EP | 2226847 A | 9/2010 |
| EP | 2408011 A | 1/2012 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-367277 A | 12/1992 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-220817 A | 8/2007 |
| JP | 2008-141119 A | 6/2008 |
| JP | 2008-283046 A | 11/2008 |
| JP | 2009-141002 A | 6/2009 |
| JP | 2009-272427 A | 11/2009 |
| JP | 2009-278115 A | 11/2009 |
| JP | 2010-093070 A | 4/2010 |
| JP | 2010-135462 A | 6/2010 |
| JP | 2010-135762 A | 6/2010 |
| JP | 2010-141230 A | 6/2010 |
| JP | 2011-071503 A | 4/2011 |
| JP | 2011-109646 A | 6/2011 |
| JP | 2011-119706 A | 6/2011 |
| JP | 2011-146694 A | 7/2011 |
| JP | 2012-015436 A | 1/2012 |
| JP | 2012-023352 A | 2/2012 |
| JP | 2012-033836 A | 2/2012 |
| JP | 2012-049513 A | 3/2012 |
| JP | 2012-054544 A | 3/2012 |
| JP | 2012-119667 A | 6/2012 |
| JP | 2012-151454 A | 8/2012 |
| JP | 2012-151455 A | 8/2012 |
| WO | WO-2004/114391 | 12/2004 |
| WO | WO-2008/069286 | 6/2008 |
| WO | WO-2008/143021 | 11/2008 |
| WO | WO-2009/072532 | 6/2009 |
| WO | WO-2009/136645 | 11/2009 |
| WO | WO-2010/050419 | 5/2010 |
| WO | WO-2011/049005 | 4/2011 |
| WO | WO-2011/052384 | 5/2011 |
| WO | WO-2011/074407 | 6/2011 |
| WO | WO-2011/158888 | 12/2011 |
| WO | WO-2012/090799 | 7/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 2, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-392.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Taiwanese Office Action (Application No. 102121736) dated Feb. 3, 2017.

\* cited by examiner

SEMICONDUCTOR DEVICE AND METHOD FOR MANUFACTURING SEMICONDUCTOR DEVICE

CROSS-REFERENCE TO RELATED APPLICATIONS

This application is a divisional of U.S. application Ser. No. 13/924,757, filed Jun. 24, 2013, now allowed, which claims the benefit of a foreign priority application filed in Japan as Serial No. 2012-147633 on Jun. 29, 2012, both of which are incorporated by reference.

BACKGROUND OF THE INVENTION

1. Field of the Invention

One embodiment of the present invention relates to a semiconductor device and a method for manufacturing the semiconductor device.

In this specification, the semiconductor device refers to all the devices that operate by utilizing semiconductor characteristics. For example, electro-optical devices, semiconductor circuits, and electronic devices are all included in the category of the semiconductor device.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon film is widely known as the semiconductor thin film applicable to the transistor. As another film, an oxide semiconductor film has attracted attention.

An improvement in performance of a semiconductor device including the transistor requires an improvement in on-state characteristics and achievement of high-speed operation of a transistor including an oxide semiconductor film. As a method to improve the on-state characteristics of the transistor, the following method is known: nitrogen is injected to reduce resistance of the oxide semiconductor film and thus reduce contact resistance between the oxide semiconductor film and a source electrode layer and contact resistance between the oxide semiconductor film and a drain electrode layer.

For example, Patent Document 1 discloses a field-effect transistor in which an amorphous oxide semiconductor film containing zinc, indium, and oxygen is used, in which resistance of the oxide semiconductor film is reduced by adding nitrogen to the oxide semiconductor film by an ion implantation method, and in which a portion containing nitrogen serves as a source portion or a drain portion and a portion containing no nitrogen serves as a channel portion.

REFERENCE

Patent Document

[Patent Document 1] Japanese Published Patent Application No. 2010-93070

SUMMARY OF THE INVENTION

In a transistor including an oxide semiconductor film, unintended impurities such as hydrogen or moisture enter the oxide semiconductor film to form carriers, which causes a problem in that electric characteristics of the transistor vary.

Thus, an object of one embodiment of the present invention is to achieve improved on-state characteristics and high-speed operation of a transistor including an oxide semiconductor film and improve reliability of the transistor by imparting stable electric characteristics to the transistor. Alternatively, an object of one embodiment of the present invention is to improve on-state characteristics of a transistor including an oxide semiconductor film. Alternatively, an object of one embodiment of the present invention is to impart stable electric characteristics to the transistor and thus improve reliability of a transistor. Alternatively, an object of one embodiment of the present invention is to manufacture a semiconductor device without complicating the process.

In a top-gate transistor in which an oxide semiconductor film, a gate insulating film, a gate electrode layer, and a silicon nitride film are stacked in this order and the oxide semiconductor film includes a channel formation region, nitrogen is added to regions of part of the oxide semiconductor film and the regions become low-resistance regions by forming a silicon nitride film over and in contact with the oxide semiconductor film. A source electrode layer and a drain electrode layer are in contact with the low-resistance regions of the oxide semiconductor film. A region of the oxide semiconductor film, which is not in contact with the silicon nitride film (that is, a region overlapping with the gate insulating film and the gate electrode layer) becomes the channel formation region.

Thus, one embodiment of the present invention is a semiconductor device which includes the following: an oxide semiconductor film including a channel formation region and a pair of low-resistance regions between which the channel formation region is sandwiched and which contains nitrogen; a stack of a gate insulating film and a gate electrode layer over the channel formation region; a silicon nitride film in contact with the low-resistance regions; and a source electrode layer and a drain electrode layer electrically connected to the respective pair of low-resistance regions. In the silicon nitride film, a peak of the number of released hydrogen molecules does not appear at a temperature lower than or equal to 500° C. in thermal desorption spectroscopy.

Alternatively, one embodiment of the present invention is a semiconductor device including an oxide semiconductor film, a gate insulating film over the oxide semiconductor film, a gate electrode layer over the gate insulating film, a silicon nitride film which is over the oxide semiconductor film, the gate insulating film, and the gate electrode layer and which includes openings reaching the oxide semiconductor film, and a source electrode layer and a drain electrode layer over the silicon nitride film and in contact with the oxide semiconductor film through the openings. In the silicon nitride film, a peak of the number of released hydrogen molecules does not appear at a temperature lower than or equal to 500° C. in thermal desorption spectroscopy.

The number of released hydrogen molecules in the silicon nitride film is lower than or equal to $1.5 \times 10^{20}/cm^3$, preferably lower than or equal to $1.0 \times 10^{20}/cm^3$, more preferably lower than or equal to $7.5 \times 10^{19}/cm^3$ at a temperature lower than or equal to 550° C. in thermal desorption spectroscopy. Further, in thermal desorption spectroscopy, a peak of the number of released hydrogen molecules does not appear at a temperature lower than or equal to 500° C.; thus, in thermal desorption spectroscopy, a temperature at which the number of released hydrogen molecules becomes higher than or equal to $1.0 \times 10^{20}/cm^3$ is higher than or equal to 500° C., preferably higher than or equal to 550° C.

The channel formation region and the low-resistance regions each may be a region including a crystal having a c-axis which is substantially perpendicular to a surface of the region. Alternatively, the channel formation region may be a region including a crystal having a c-axis which is substantially perpendicular to a surface of the region and the low-resistance regions may be amorphous regions.

The silicon nitride film may serve as an interlayer insulating film covering the oxide semiconductor film, the gate insulating film, and the gate electrode layer. Alternatively, the silicon nitride film may serve as sidewall insulating films in contact with side surfaces of the gate insulating film and side surfaces of the gate electrode layer.

Further, one embodiment of the present invention is a semiconductor device in which an oxide semiconductor film includes a channel formation region overlapping with a gate electrode layer, a pair of first low-resistance regions which overlaps with sidewall insulating films and contains nitrogen and between which the channel formation region is sandwiched, and a pair of second low-resistance regions which is in contact with a source electrode layer and a drain electrode layer, respectively, and contains an impurity element and between which the channel formation region and the first low-resistance regions are sandwiched. The impurity element is phosphorus or boron, and the second low-resistance regions have lower resistance than the first low-resistance regions.

The oxide semiconductor film may be a region including a crystal having a c-axis which is substantially perpendicular to a surface of the region and the second low-resistance regions may be amorphous regions.

One embodiment of the present invention is a method for manufacturing a semiconductor device including the following steps: forming an oxide semiconductor film; forming a gate insulating film over the oxide semiconductor film; forming a gate electrode layer over the gate insulating film; etching the gate insulating film with the gate electrode layer used as a mask to expose part of the oxide semiconductor film; depositing a silicon nitride film in contact with the exposed part of the oxide semiconductor film, in the silicon nitride film, a peak of the number of released hydrogen molecules does not appear at a temperature lower than or equal to 500° C. in thermal desorption spectroscopy, so that nitrogen is added to a region of the oxide semiconductor film which is in contact with the silicon nitride film to form a low-resistance region; and forming a source electrode layer or a drain electrode layer electrically connected to the low-resistance region. As a deposition gas for the silicon nitride film, a mixed gas containing silane and nitrogen is used.

One embodiment of the present invention is a method for manufacturing a semiconductor device including the following steps: forming an oxide semiconductor film; forming a gate insulating film over the oxide semiconductor film; forming a gate electrode layer over the gate insulating film; etching the gate insulating film with use of the gate electrode layer as a mask to expose part of the oxide semiconductor film; depositing a silicon nitride film in contact with the exposed part of the oxide semiconductor film, in the silicon nitride film, a peak of the number of released hydrogen molecules does not appear at a temperature lower than or equal to 500° C. in thermal desorption spectroscopy, so that nitrogen is added to a region of the oxide semiconductor film which is in contact with the silicon nitride film to form a low-resistance region; and forming a source electrode layer or a drain electrode layer electrically connected to the low-resistance region. A mixed gas containing silane, nitrogen, and ammonia is used for deposition of the silicon nitride film and the flow ratio of ammonia to nitrogen in the deposition gas is less than or equal to 0.1.

One embodiment of the present invention is a method for manufacturing a semiconductor device including the following steps: forming an oxide semiconductor film; depositing an insulating film over the oxide semiconductor film; depositing a conductive film over the insulating film; processing the conductive film and the insulating film to form a gate electrode layer and a gate insulating film; depositing a silicon nitride film over the oxide semiconductor film, the gate insulating film, and the gate electrode layer, so that nitrogen is added to a region of the oxide semiconductor film which is in contact with the silicon nitride film to form a low-resistance region; etching part of the silicon nitride film to form an opening reaching the oxide semiconductor film; and forming a source electrode layer or a drain electrode layer over the oxide semiconductor film and the silicon nitride film. A deposition gas containing silane, nitrogen, and ammonia is used for deposition of the silicon nitride film and the flow ratio of ammonia to nitrogen in the deposition gas is less than or equal to 0.1.

Further, after the gate electrode layer is formed, an impurity element such as phosphorus or boron may be added to the oxide semiconductor film with the gate electrode layer used as a mask.

By etching the silicon nitride film, sidewall insulating films may be formed in contact with side surfaces of the gate electrode layer and an impurity element such as phosphorus or boron may be added to the oxide semiconductor film with the gate electrode layer and the sidewall insulating films used as a mask.

Further, heat treatment may be performed after the silicon nitride film is formed.

According to one embodiment of the present invention, on-state characteristics of a transistor including an oxide semiconductor film can be improved. Alternatively, stable electric characteristics can be imparted to a transistor including an oxide semiconductor film, so that reliability thereof can be improved. Further, a semiconductor device can be manufactured without complicating the process.

DETAILED DESCRIPTION OF THE INVENTION

Figure 1A:
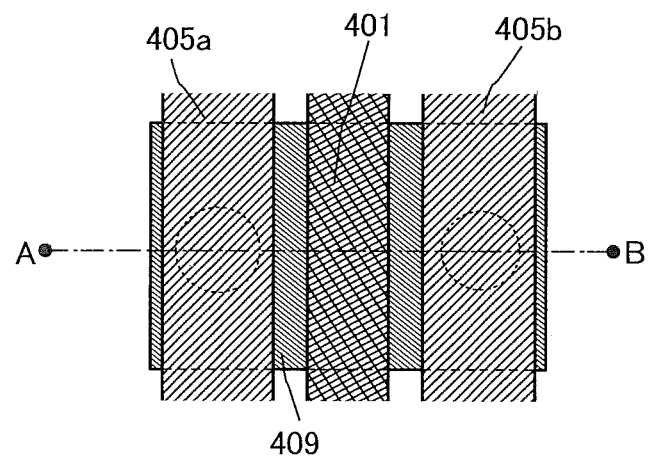
FIGS. 1A and 1B are respectively a top view and a cross-sectional view illustrating a semiconductor device according to one embodiment of the present invention.

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to description of the embodiments.

Further, in embodiments hereinafter described, the same parts are denoted with the same reference numerals throughout the drawings. The thickness, width, relative relation of position, and the like of elements illustrated in the drawings are exaggerated for clarification of description of the embodiments in some cases.

Note that the term such as "over" in this specification and the like does not necessarily mean that a component is placed "directly on" another component. For example, the expression "a gate electrode layer over an insulating film" can mean the case where there is an additional component between the insulating film and the gate electrode layer. The same applies to the term "under".

In this specification and the like, the term "electrode layer" or "wiring layer" does not limit the function of components. For example, an "electrode layer" can be used as part of a "wiring layer", and the "wiring layer" can be used as part of the "electrode layer". In addition, the term "electrode layer" or "wiring layer" can also mean a combination of a plurality of "electrode layers" and "wiring layers", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" include an electrode and a wiring.

Embodiment 1

Figure 1B:
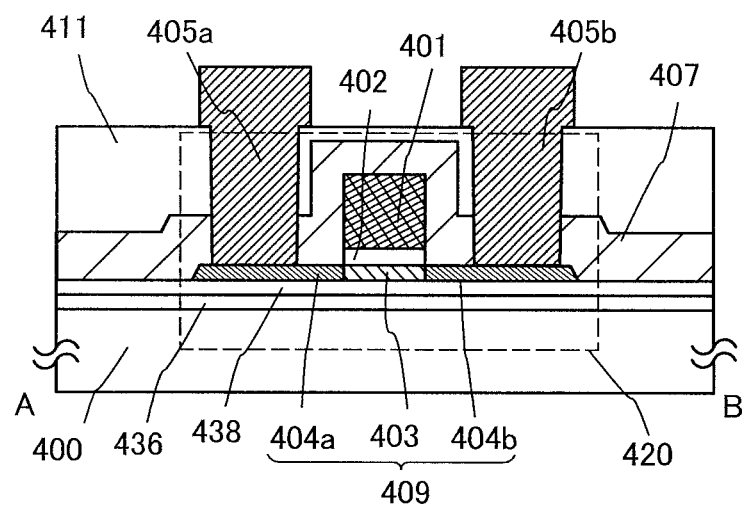

In this embodiment, a semiconductor device according to one embodiment of the present invention is described in detail with reference to drawings. FIGS. 1A and 1B are respectively a top view and a cross-sectional view of a transistor 420 that is a semiconductor device according to one embodiment of the present invention. FIG. 1A is the top view of the transistor 420, and FIG. 1B is the cross-sectional view taken along dashed-dotted line A-B in FIG. 1A.

The transistor 420 in FIGS. 1A and 1B includes the following: a base insulating film 436 over a substrate 400; an oxide semiconductor film 409 which is over the base insulating film 436 and includes a channel formation region 403, a low-resistance region 404a, and a low-resistance region 404b; a gate insulating film 402 and a gate electrode layer 401 which are over the channel formation region 403; a silicon nitride film 407 over the oxide semiconductor film 409, the gate insulating film 402, and the gate electrode layer 401; an interlayer insulating film 411 over the silicon nitride film 407; and a source electrode layer 405a and a drain electrode layer 405b which are electrically connected to the low-resistance region 404a and the low-resistance region 404b, respectively, through openings provided in the silicon nitride film 407 and the interlayer insulating film 411.

Since the silicon nitride film 407 is formed in contact with the oxide semiconductor film, the hydrogen concentration in the silicon nitride film 407 is preferably reduced as much as possible and the number of released hydrogen molecules in the silicon nitride film 407 is preferably reduced. For example, it is preferable that a peak of the number of released hydrogen molecules do not appear at a temperature lower than or equal to 500° C. when measurement is performed by thermal desorption spectroscopy (TDS). In the TDS, it is also preferable that at a temperature lower than or equal to 500° C., for example, the number of released hydrogen molecules be lower than or equal to $1.5 \times 10^{20}/cm^3$, preferably lower than or equal to $1.0 \times 10^{20}/cm^3$, more preferably lower than or equal to $7.5 \times 10^{19}/cm^3$. Alternatively, it is preferable that a temperature at which the number of released hydrogen molecules is higher than or equal to $1.0 \times 10^{20}/cm^3$ be higher than or equal to 500° C., preferably higher than or equal to 550° C.

Further, it is preferable that the hydrogen concentration in the silicon nitride film be lower than or equal to $2.0 \times 10^{22}$ atoms/$cm^3$, preferably lower than or equal to $1.5 \times 10^{22}$ atoms/$cm^3$ in secondary ion mass spectrometry (SIMS).

Further, when composition of the silicon nitride film is measured by Rutherford backscattering spectrometry (RBS), the hydrogen concentration is preferably lower than or equal to 15 atomic %, more preferably lower than or equal to 10 atomic %.

By depositing the silicon nitride film 407 over and in contact with the oxide semiconductor film 409, nitrogen is added to a region of the oxide semiconductor film 409, which is in contact with the silicon nitride film, whereby regions whose resistance is reduced (the low-resistance regions 404a and 404b) are formed. The low-resistance regions 404a and 404b have lower electric resistance than the channel formation region 403.

Further, the oxide semiconductor film 409 is preferably a c-axis aligned crystalline oxide semiconductor (CAAC-OS) film including a crystal having a c-axis which is substantially perpendicular to a surface of the film. In this embodiment, a CAAC-OS film is used as the oxide semiconductor film 409.

In this embodiment, in a deposition step of the silicon nitride film 407, nitrogen is added to the oxide semiconductor film 409 to form the low-resistance regions 404a and 404b; thus, the low-resistance regions 404a and 404b can keep crystallinity to be referred to as a CAAC-OS film. Accordingly, in the oxide semiconductor film 409 in this embodiment, the channel formation region 403 and the low-resistance regions 404a and 404b include a crystal having a c-axis which is substantially perpendicular to a surface of the film.

In the transistor 420, the source electrode layer 405a and the drain electrode layer 405b are in contact with the regions of the oxide semiconductor film 409, which have low resistance; thus, contact resistance between the oxide semiconductor film 409 and the source electrode layer 405a and contact resistance between the oxide semiconductor film 409 and the drain electrode layer 405b are reduced. Therefore, the transistor 420 has high on-state characteristics (e.g., on-state current and field-effect mobility), and a semiconductor device capable of high-speed operation and high-speed response can be obtained.

Further, in the deposition step of the silicon nitride film 407 serving as an interlayer insulating film, nitrogen is added to the oxide semiconductor film 409 to form the low-resistance regions 404a and 404b; thus, the on-state characteristics of the transistor 420 can be improved without complicating the process.

Figure 2A:
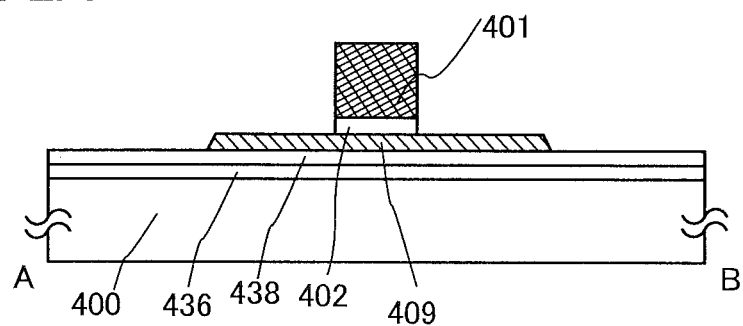
FIGS. 2A to 2C are views illustrating a method for manufacturing a semiconductor device, according to one embodiment of the present invention.

Next, a method for manufacturing the transistor 420 is described with reference to FIGS. 2A to 2C.

First, the base insulating film 436 and the base insulating film 438 are deposited over the substrate 400.

There is no particular limitation on a substrate that can be used, as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used.

A single crystal semiconductor substrate or a polycrystalline semiconductor substrate of silicon, silicon carbide, or the like; a compound semiconductor substrate of silicon germanium or the like; or the like may be used as the substrate 400. Alternatively, an SOI substrate, a semiconductor substrate over which a semiconductor element is provided, or the like can be used.

For the formation of the base insulating films 436 and 438, a sputtering method, a molecular beam epitaxy (MBE) method, a chemical vapor deposition (CVD) method, a pulsed laser deposition (PLD) method, an atomic layer deposition (ALD) method, or the like can be employed as appropriate. Note that when the base insulating film 438 is formed by a sputtering method, impurity elements such as hydrogen can be reduced and hydrogen can be prevented from entering an oxide semiconductor film to be formed later.

An inorganic insulating film may be used as each of the base insulating films 436 and 438. It is preferable to use, for example, a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, or an aluminum nitride oxide film. Further, the base insulating films 436 and 438 each can be formed with a single-layer structure or a stacked-layer structure including two or more layers with the use of these compounds. The base insulating films 436 and 438 may include the same material or different materials.

Note that here, silicon oxynitride contains more oxygen than nitrogen and contains, for example, oxygen, nitrogen, and silicon at concentrations higher than or equal to 50 atomic % and lower than or equal to 70 atomic %, higher than or equal to 0.5 atomic % and lower than or equal to 15 atomic %, and higher than or equal to 25 atomic % and lower than or equal to 35 atomic %, respectively. Note that the above ranges are obtained in the case where measurement is performed using Rutherford backscattering spectrometry and hydrogen forward scattering (HFS). Moreover, the total percentage of the constituent elements does not exceed 100 atomic %.

In the transistor 420, the base insulating film 436 preferably has a function of preventing entry of impurities such as hydrogen and moisture from the substrate 400 into the oxide semiconductor film 409 to be formed later. Accordingly, an inorganic insulating film such as a silicon nitride film, an aluminum oxide film, a silicon oxynitride film, an aluminum nitride film, or an aluminum nitride oxide film can be preferably used as the base insulating film 436. In particular, a silicon nitride film is preferably used because it has a high shielding effect (blocking effect) against both of oxygen and impurities such as hydrogen and moisture.

Because the base insulating film 438 is in contact with the oxide semiconductor film 409 to be formed later, the base insulating film 438 preferably contains oxygen which exceeds at least the stoichiometric composition in the layer (the bulk). For example, in the case where a silicon oxide film is used as the base insulating film 438, $SiO_{2+\alpha}$ ($\alpha>0$) is used.

Further, planarization treatment may be performed on the base insulating film 438 in order to improve the planarity of the oxide semiconductor film 409 to be formed later. As the planarization treatment, for example, chemical mechanical polishing (CMP) treatment, dry etching treatment, or the like can be performed. As the etching gas, a chlorine-based gas such as a chlorine gas, a boron chloride gas, a silicon chloride gas, or a carbon tetrachloride gas, a fluorine-based gas such as a carbon tetrafluoride gas, a sulfur fluoride gas, or a nitrogen fluoride gas, or the like can be used.

Note that the base insulating film is not necessarily provided as long as insulation between the substrate 400 and the oxide semiconductor film 409 to be formed later can be ensured.

In this embodiment, a silicon nitride film is used as the base insulating film 436, and a silicon oxide film is used as the base insulating film 438.

Subsequently, an oxide semiconductor film to be the oxide semiconductor film 409 is formed over the base insulating film 438.

The oxide semiconductor film preferably contains at least indium (In) or zinc (Zn). Alternatively, the oxide semiconductor film preferably contains both In and Zn. In order to reduce variation in electric characteristics of the transistor including the oxide semiconductor film, the oxide semiconductor film preferably contains one or more of stabilizers in addition to In or Zn.

As a stabilizer, gallium (Ga), tin (Sn), hafnium (Hf), aluminum (Al), zirconium (Zr), or the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, the following can be used: a single component metal oxide such as indium oxide, tin oxide, or zinc oxide; a two-component metal oxide such as an In—Zn oxide, a Sn—Zn oxide, an Al—Zn oxide, a Zn—Mg oxide, a Sn—Mg oxide, an In—Mg oxide, or an In—Ga oxide; a three-component metal oxide such as an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, or an In—Lu—Zn oxide; or a four-component metal oxide such as an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that, for example, an In—Ga—Zn oxide means an oxide containing In, Ga, and Zn as its main components and there is no particular limitation on the ratio of In, Ga, and Zn. The In—Ga—Zn oxide may contain a metal element other than In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, n is an integer) may be used.

For example, it is possible to use an In—Ga—Zn oxide containing In, Ga, and Zn at an atomic ratio of 1:1:1, 2:2:1, or 3:1:2, or any of oxides whose composition is in the neighborhood of the above compositions. Alternatively, an In—Sn—Zn oxide containing In, Sn, and Zn at an atomic ratio of 1:1:1, 2:1:3, or 2:1:5, or any of oxides whose composition is in the neighborhood of the above compositions may be used.

However, the composition is not limited to those described above, and a material having the appropriate composition may be used depending on needed semiconductor characteristics and electric characteristics (e.g., field-effect mobility, threshold voltage, and variation). In order to obtain needed semiconductor characteristics, it is preferable that the carrier density, the impurity concentration, the defect density, the atomic ratio of a metal element and oxygen, the interatomic distance, the density, and the like be set to be appropriate.

For example, high carrier mobility can be obtained relatively easily in the case where the In—Sn—Zn oxide is used. However, carrier mobility can be increased by reducing the defect density in the bulk also in the case where the In—Ga—Zn oxide is used.

Further, the energy gap of the oxide semiconductor film used in this embodiment is greater than or equal to 2 eV, preferably greater than or equal to 2.5 eV, more preferably greater than or equal to 3 eV. The off-state current of a transistor can be reduced by using an oxide semiconductor film having a wide energy gap.

A structure of an oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a CAAC-OS film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fits inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

Alternatively, the oxide semiconductor film may have a stacked-layer structure of a plurality of oxide semiconductor films. For example, the oxide semiconductor film may have a stacked-layer structure of a first oxide semiconductor film and a second oxide semiconductor film which are formed using metal oxides with different compositions. Alternatively, for example, the first oxide semiconductor film may be formed using any of two-component metal oxide, a three-component metal oxide, and a four-component metal oxide, and the second oxide semiconductor film may be formed using any of these which is different from the oxide for the first oxide semiconductor film.

Further, the constituent elements of the first oxide semiconductor film and the second oxide semiconductor film may be made the same and the composition of the constituent elements of the first oxide semiconductor film and the second oxide semiconductor film may be made different. For example, the first oxide semiconductor film may contain In, Ga, and Zn at an atomic ratio of 1:1:1, and the second oxide semiconductor film may contain In, Ga, and Zn at an atomic ratio of 3:1:2. Alternatively, the first oxide semiconductor film may contain In, Ga, and Zn at an atomic ratio of 1:3:2, and the second oxide semiconductor film may contain In, Ga, and Zn at an atomic ratio of 2:1:3.

At this time, one of the first oxide semiconductor film and the second oxide semiconductor film, which is closer to the gate electrode layer 401 to be formed later (on the channel side), preferably contains In and Ga at a proportion of In>Ga. The other oxide semiconductor film, which is farther from the gate electrode layer 401 (on the back channel side), preferably contains In and Ga at a proportion of In☐Ga.

Further, the oxide semiconductor film may have a three-layer structure of a first oxide semiconductor film, a second oxide semiconductor film, and a third oxide semiconductor film, in which the constituent elements thereof are made the same and the composition of the constituent elements of the first oxide semiconductor film, the second oxide semiconductor film, and the third oxide semiconductor film is made different. For example, the first oxide semiconductor film may contain In, Ga, and Zn at an atomic ratio of 1:3:2, the second oxide semiconductor film may contain In, Ga, and Zn at an atomic ratio of 3:1:2, and the third oxide semiconductor film may contain In, Ga, and Zn at an atomic ratio of 1:1:1.

An oxide semiconductor film which contains less In than Ga and Zn at an atomic ratio, typically, the first oxide semiconductor film containing In, Ga, and Zn at an atomic ratio of 1:3:2, has a higher insulating property than an oxide semiconductor film containing more In than Ga and Zn at an atomic ratio, typically, the second oxide semiconductor film, and an oxide semiconductor film containing Ga, Zn, and In at the same atomic ratio, typically, the third oxide semiconductor film. Accordingly, the first oxide semiconductor film may be provided on a side close to the gate electrode layer 401 so as to serve as a gate insulating film. Note that the first oxide semiconductor film containing In, Ga, and Zn at an atomic ratio of 1:3:2 may have an amorphous structure.

Since the constituent elements of the first oxide semiconductor film, the second oxide semiconductor film, and the third oxide semiconductor film are the same, the first oxide semiconductor film has fewer trap levels at the interface with the second oxide semiconductor film. Therefore, when the oxide semiconductor film has the above structure, the amount of change in the threshold voltage of the transistor due to a change over time or a BT photostress test can be reduced.

In an oxide semiconductor, the s orbital of heavy metal mainly contributes to carrier transfer, and when the In content in the oxide semiconductor is increased, overlap of the s orbitals is likely to be increased. Therefore, an oxide semiconductor having an atomic ratio of In>Ga has higher carrier mobility than an oxide semiconductor having an atomic ratio of In≤Ga. Further, in Ga, the formation energy of an oxygen vacancy is larger and thus an oxygen vacancy is less likely to occur than in In; therefore, the oxide semiconductor having an atomic ratio of In≤Ga has more stable characteristics than the oxide semiconductor having an atomic ratio of In>Ga.

An oxide semiconductor having an atomic ratio of In>Ga is used on the channel side and an oxide semiconductor having an atomic ratio of In≤Ga is used on the back channel side, whereby the field-effect mobility and reliability of the transistor can be further improved.

Further, in the case where the oxide semiconductor film 409 has a stacked-layer structure, the first oxide semiconductor film, the second oxide semiconductor film, and the third oxide semiconductor film may be formed using oxide semiconductor films having different crystallinity. That is, the oxide semiconductor film may be formed using any of a single crystal oxide semiconductor film, a polycrystalline oxide semiconductor film, an amorphous oxide semiconductor film, and a CAAC-OS film, as appropriate. When an amorphous oxide semiconductor film is applied to any of the first oxide semiconductor film, the second oxide semiconductor film, and the third oxide semiconductor film, internal stress or external stress of the oxide semiconductor film is relieved, change in characteristics of the transistor is reduced, and reliability of the transistor can be further improved.

The thickness of the oxide semiconductor film is preferably greater than or equal to 1 nm and less than or equal to 100 nm, more preferably greater than or equal to 1 nm and less than or equal to 50 nm, still more preferably greater than or equal to 1 nm and less than or equal to 30 nm, further preferably greater than or equal to 3 nm and less than or equal to 20 nm.

In the oxide semiconductor film, the concentration of an alkali metal or an alkaline earth metal obtained by secondary ion mass spectrometry (SIMS) is preferably lower than or equal to $1 \times 10^{18}$ atoms/cm$^3$, more preferably lower than or equal to $2 \times 10^{16}$ atoms/cm$^3$. This is because when an alkali metal or an alkaline earth metal is bonded to an oxide semiconductor, carriers are generated in some cases, which causes an increase in off-state current of the transistor.

In the oxide semiconductor film, the hydrogen concentration obtained by secondary ion mass spectrometry is set to be lower than or equal to $1 \times 10^{16}$ atoms/cm$^3$, lower than or equal to $5 \times 10^{17}$ atoms/cm$^3$, lower than or equal to $1 \times 10^{18}$ atoms/cm$^3$, lower than $5 \times 10^{18}$ atoms/cm$^3$, lower than $1 \times 10^{19}$ atoms/cm$^3$, lower than $5 \times 10^{19}$ atoms/cm$^3$, or lower than $1 \times 10^{20}$ atoms/cm$^3$ in order of preference.

Hydrogen contained in the oxide semiconductor film reacts with oxygen bonded to a metal atom to produce water, and a defect is formed in a lattice from which oxygen is released (or a portion from which oxygen is released). In addition, a bond of part of hydrogen and oxygen causes generation of electrons serving as carriers. Thus, entry of the impurities containing hydrogen is reduced as much as possible in the deposition step of the oxide semiconductor film, whereby the hydrogen concentration in the oxide semiconductor film can be reduced. When hydrogen is removed as much as possible and a highly purified oxide semiconductor film is used as a channel formation region, a negative shift in the threshold voltage can be reduced. In addition, leakage current (also referred to as off-state current) per micrometer of channel width between a source and a drain of the transistor can be reduced to several yA/μm to several zA/μm. Accordingly, electric characteristics of the transistor can be improved with the use of a highly purified oxide semiconductor film.

The oxide semiconductor film is formed by a sputtering method, a coating method, a pulsed laser deposition method, a laser ablation method, or the like.

In the case where the oxide semiconductor film is formed by a sputtering method, a power supply device for generating plasma can be an RF power supply device, an AC power supply device, a DC power supply device, or the like as appropriate.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas.

Further, a target may be selected as appropriate depending on the composition of the oxide semiconductor film to be formed.

When a CAAC-OS film is formed, for example, the CAAC-OS film is formed by a sputtering method using a polycrystalline oxide semiconductor sputtering target. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining their crystal structures, whereby the CAAC-OS film can be deposited.

For the deposition of the CAAC-OS film, the following conditions are preferably used.

By reducing the amount of impurities entering the CAAC-OS film during the deposition, the crystal structure can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C., can be used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate surface, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol % L☐ preferably 100 vol %.

As an example of the sputtering target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

After the oxide semiconductor film is formed, heat treatment may be performed so that the oxide semiconductor film is dehydrated or dehydrogenated. The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an atmosphere of an inert gas including nitrogen or a rare gas such as helium, neon, argon, xenon, or krypton. Alternatively, the heat treatment may be performed under an atmosphere of an inert gas first, and then under an oxygen atmosphere. It is preferable that the above inert gas atmosphere and the above oxygen atmosphere do not contain hydrogen, water, and the like. The treatment time is 3 minutes to 24 hours.

Heat treatment is performed after the oxide semiconductor film is formed, so that the hydrogen concentration in the oxide semiconductor film can be lower than $1\times10^{20}$ atoms/$cm^3$, lower than $5\times10^{19}$ atoms/$cm^3$, lower than $1\times10^{19}$ atoms/$cm^3$, lower than $5\times10^{18}$ atoms/$cm^3$, lower than or equal to $1\times10^{18}$ atoms/$cm^3$, lower than or equal to $5\times10^{17}$ atoms/$cm^3$, or lower than or equal to $1\times10^{16}$ atoms/$cm^3$.

Note that in the case where an oxide insulating film is used as the base insulating film 438, when heat treatment is performed while the oxide semiconductor film is provided over the oxide insulating film, oxygen can be supplied to the oxide semiconductor film, oxygen defects in the oxide semiconductor film can be reduced, and semiconductor characteristics can be improved in some cases. Heat treatment may be performed in a state where the oxide semiconductor film and the oxide insulating film are in contact with each other at least partly to supply oxygen to the oxide semiconductor film.

Then, after a mask is formed over the oxide semiconductor film by a photolithography process, the oxide semiconductor film is partly etched using the mask. Accordingly, the oxide semiconductor film 409 is formed as illustrated in FIG. 2A. After that, the mask is removed. Note that heat treatment by which oxygen is supplied from the base insulating film 438 to the oxide semiconductor film 409 may be performed before or after the oxide semiconductor film is processed into an island-like shape. Note that by performing the heat treatment before the oxide semiconductor film is processed into an island-like shape, a larger amount of oxygen can be supplied to the oxide semiconductor film 409 because a smaller amount of oxygen is released from the base insulating layer 438 to the outside.

With the use of a printing method for formation of the oxide semiconductor film, the island-shaped oxide semiconductor film 409 can be formed directly.

Next, an insulating film to be the gate insulating film 402 is formed over the oxide semiconductor film 409.

The gate insulating film 402 is preferably formed using an oxide insulating film including silicon oxide, gallium oxide, aluminum oxide, silicon oxynitride, silicon nitride oxide, hafnium oxide, tantalum oxide, or the like. The use of a high-k material such as hafnium oxide, yttrium oxide, hafnium silicate ($HfSi_xO_y$ ($x>0$, $y>0$)), hafnium silicate to which nitrogen is added, hafnium aluminate ($HfAl_xO_y$ ($x>0$, $y>0$)), or lanthanum oxide enables a reduction in gate leakage current. The gate insulating film may have a single-layer structure or a stacked-layer structure.

The gate insulating film 402 has a thickness greater than or equal to 1 nm and less than or equal to 100 nm and can be formed by a sputtering method, an MBE method, a CVD method, a PLD method, an ALD method, or the like as appropriate. The gate insulating film may be formed with a sputtering apparatus which performs deposition with surfaces of a plurality of substrates set substantially perpendicular to a surface of a sputtering target.

Like the base insulating film 438, the gate insulating film 402 is in contact with the oxide semiconductor film. Therefore, the gate insulating film 402 preferably contains oxygen which exceeds at least the stoichiometric composition in the film (the bulk).

In this embodiment, a 20-nm-thick silicon oxynitride film is formed by a CVD method.

Next, the gate electrode layer 401 is formed over the gate insulating film 402 and the gate insulating film is etched using the gate electrode layer as a mask, so that the oxide semiconductor film is partly exposed. The structure at this stage is illustrated in FIG. 2A.

The gate electrode layer 401 can be formed using a metal material such as molybdenum, titanium, tantalum, tungsten, aluminum, copper, chromium, neodymium, or scandium or an alloy material which contains any of these materials as its main component. As the gate electrode layer 401, a semiconductor film typified by a polycrystalline silicon film to which an impurity element such as phosphorus is added, or a silicide film such as a nickel silicide film may be used. Further, the gate electrode layer 401 can also be formed using a conductive material such as indium tin oxide, indium tungsten oxide, tungsten indium zinc oxide, titanium indium oxide, titanium indium tin oxide, indium zinc oxide, or silicon indium tin oxide. It is also possible that the gate electrode layer 401 has a stacked-layer structure of the above conductive material and the above metal material.

As one layer of the gate electrode layer 401 which is in contact with the gate insulating film 402, a metal oxide film containing nitrogen, specifically, an In—Ga—Zn oxide film containing nitrogen, an In—Sn oxide film containing nitrogen, an In—Ga oxide film containing nitrogen, an In—Zn oxide film containing nitrogen, a Sn oxide film containing nitrogen, an In oxide film containing nitrogen, or a metal nitride (e.g., InN or SnN) film can be used. These films each have a work function of 5 eV or higher, preferably 5.5 eV or higher, which enables the threshold voltage of the transistor to be positive when used as the gate electrode layer. Accordingly, a so-called normally off switching element can be provided.

The thickness of the gate electrode layer 401 is preferably greater than or equal to 50 nm and less than or equal to 300 nm. In this embodiment, a 30-nm-thick tantalum nitride film and a 200-nm-thick tungsten film are stacked by a sputtering method.

After the gate electrode layer 401 is formed, the gate insulating film 402 is etched using the gate electrode layer 401 as a mask, so that the oxide semiconductor film 409 is partly exposed.

Then, the silicon nitride film 407 is formed over the oxide semiconductor film 409, the gate insulating film 402, and the gate electrode layer 401 so as to be in contact with exposed regions of the oxide semiconductor film. By deposition of the silicon nitride film 407, nitrogen is added to regions of the oxide semiconductor film 409, which are in contact with the silicon nitride film 407 (also referred to as regions exposed by etching of the gate insulating film 402), whereby the low-resistance region 404a and the low-resistance region 404b are formed. Note that nitrogen is not added to an unexposed region of the oxide semiconductor film 409 (also referred to as a region which overlaps with the gate electrode layer 401 and the gate insulating film 402), whereby the channel formation region 403 is formed.

For the deposition of the silicon nitride film 407, a plasma CVD method or a sputtering method can be employed. A mixed gas of silane ($SiH_4$) and nitrogen ($N_2$) or a mixed gas of silane ($SiH_4$), nitrogen ($N_2$), and ammonia ($NH_3$) can be used as a deposition gas.

In order to reduce the number of hydrogen molecules released from the silicon nitride film 407, the flow rate of ammonia in the deposition gas is preferably as low as possible. For example, it is preferable that the flow ratio of ammonia to nitrogen be 0.1 or less, preferably 0.05 or less, more preferably 0.02 or less (that is, the flow ratio of nitrogen to ammonia in the deposition gas is 10 or more, preferably 20 or more, more preferably 50 or more).

When ammonia is used as the deposition gas, a bond between a silicon atom and a hydrogen atom in silane or a triple bond between nitrogen atoms in nitrogen is easily cut by dissociated ammonia in the deposition. Thus, decomposition of silane or nitrogen is promoted in the deposition, so that a dense silicon nitride film can be formed. The dense silicon nitride film can prevent entry of hydrogen, moisture, and the like from the outside into the oxide semiconductor film. Accordingly, in order to improve reliability of a semiconductor device, it is preferable that the flow rate of ammonia at the deposition of the silicon nitride film be set to an amount which promotes decomposition of silane and which suppresses the number of released hydrogen molecules.

Further, the deposition process may include a period during which the deposition gas is not supplied with keeping the substrate under nitrogen plasma conditions. When the substrate is kept under nitrogen plasma conditions, nitrogen is added to the exposed portions of the oxide semiconductor film and resistance can be further reduced in some cases.

The silicon nitride film 407 has a shielding effect of blocking penetration of both oxygen and impurities such as hydrogen, moisture, a hydroxyl group, and hydride (also referred to as a hydrogen compound). Accordingly, during and after the manufacturing process, the silicon nitride film functions as a protective film for preventing entry of impurities such as hydrogen and moisture, which cause a change, into the oxide semiconductor film and preventing out-diffusion of oxygen which is a main component material of the oxide semiconductor film.

Further, in order to add nitrogen to the oxide semiconductor film 409, heat treatment may be performed after the silicon nitride film 407 is formed. By the heat treatment, nitrogen can be added from the silicon nitride film 407 to the oxide semiconductor film 409.

Next, the interlayer insulating film 411 is formed over the silicon nitride film 407. The interlayer insulating film 411 can be formed using a material and a method similar to those of the base insulating film 436. Note that the interlayer insulating film 411 is not necessarily provided.

Next, regions of the silicon nitride film 407 and the interlayer insulating film 411, which overlap with the low-resistance regions 404a and 404b, are partly etched, so that openings reaching the low-resistance regions 404a and 404b are formed. Note that the openings are formed by selective etching with the use of a mask or the like. Dry etching, wet etching, or both wet etching and dry etching can be used to form the openings. Further, there is no particular limitation on the shapes of the openings as long as the openings reach the low-resistance regions 404a and 404b.

Figure 2B:
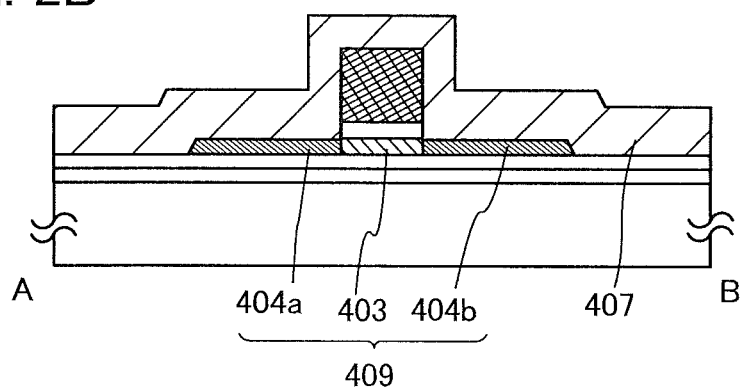
Figure 2C:
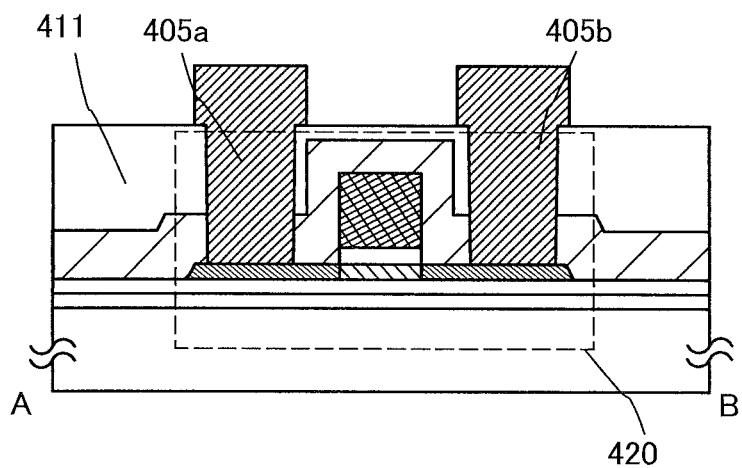

Then, a conductive material is deposited in the openings, whereby the source electrode layer 405a and the drain electrode layer 405b are formed (see FIG. 2C). The source electrode layer 405a and the drain electrode layer 405b can be formed using a material and a method similar to those of the gate electrode layer 401.

Through the above-described steps, the transistor 420 can be manufactured.

In the transistor described in this embodiment, by deposition of the silicon nitride film over the oxide semiconductor film, nitrogen is added to the oxide semiconductor film; thus, the low-resistance regions can be formed in the oxide semiconductor film 409. Further, since the oxide semiconductor film is electrically connected to the source electrode layer and the drain electrode layer in the low-resistance regions, contact resistance between the oxide semiconductor film and the source electrode layer and contact resistance between the oxide semiconductor film and the drain electrode layer are reduced. Thus, a semiconductor device with excellent on-state characteristics and favorable electric characteristics can be provided.

Further, in the deposition step of the silicon nitride film 407 serving as an interlayer insulating film, nitrogen is added to the oxide semiconductor film 409 to form the low-resistance regions 404a and 404b; thus, the on-state characteristics of the transistor 420 can be improved without complicating the process.

Further, the silicon nitride film 407 has a reduced hydrogen concentration and a small number of released hydrogen molecules. Thus, impurities such as hydrogen and moisture can be prevented from entering the oxide semiconductor film 409 from the silicon nitride film 407. In addition, since the silicon nitride film has a property of blocking entry of hydrogen and moisture from the outside, entry of impurities such as hydrogen and moisture from the outside can be prevented. Accordingly, a semiconductor device which has stable electric characteristics and high reliability can be provided.

The low-resistance regions 404a and 404b are formed by addition of nitrogen in the deposition step of the silicon nitride film 407, and a step of adding an impurity element which reduces resistance of the oxide semiconductor film may be performed in combination. By addition of an impurity element, resistance of the low-resistance regions 404a and 404b can be further reduced.

However, when an impurity element is added to the oxide semiconductor film 409 after its deposition, the crystallinity of the added region is decreased in some cases. For example, in the case where the low-resistance regions 404a and 404b are formed in the oxide semiconductor film 409 which is a CAAC-OS film by performing a step of adding nitrogen in the deposition and a step of adding an impurity element, the low-resistance regions 404a and 404b might have an amorphous structure (or a state with many amorphous structures). In this case, in the oxide semiconductor film 409, the channel formation region 403 might be a CAAC-OS film and the low-resistance regions 404a and 404b might be amorphous films (or films having many amorphous structures).

An ion implantation method, an ion doping method, or the like can be used as a method for adding an impurity element.

Phosphorus, boron, nitrogen, arsenic, argon, aluminum, a molecular ion containing any of these elements, or the like can be used as the impurity element to be added. The dosage of such an element is preferably $1 \times 10^{13}$ ions/cm² to $5 \times 10^{16}$ ions/cm². When phosphorus is added as the impurity element, the acceleration voltage is preferably 0.5 kV to 80 kV.

The treatment of adding the impurity element to the oxide semiconductor film 409 may be performed plural times. In the case where the treatment of adding the impurity element to the oxide semiconductor film 409 is performed plural times, the kind of the impurity element may be the same in the plural treatments or different in every treatment.

The impurity element may be added immediately after the oxide semiconductor film to be the oxide semiconductor film 409 is deposited or immediately after the oxide semiconductor film is processed into the island-shaped oxide semiconductor film 409. Alternatively, the impurity element may be added after the insulating film to be the gate insulating film 402 is deposited or in a state where the gate insulating film 402 is formed and the oxide semiconductor film is partly exposed. Further alternatively, the impurity element may be added after the silicon nitride film 407 is deposited. In the case where the impurity element is added in a state where the gate insulating film 402 or the silicon nitride film 407 covers the oxide semiconductor film 409, the oxide semiconductor film 409 is less damaged because the impurity element is added through the gate insulating film 402 or the silicon nitride film 407.

Note that an oxide semiconductor film having an amorphous structure is likely to absorb an impurity such as hydrogen, which serves as a donor, from an oxide semiconductor film having crystallinity such as a CAAC-OS film; thus, when the low-resistance regions between which the channel formation region 403 is sandwiched have an amorphous structure, the low resistance regions absorb the impurity (perform gettering) from the channel formation region 403 and the transistor 420 can have favorable electric characteristics in some cases.

Although not illustrated, an insulating film may be further provided over the transistor 420. As the insulating film, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

A heating step may be additionally performed after the insulating film is formed. For example, a heating step may be performed at a temperature higher than or equal to 100° C. and lower than or equal to 200° C. in the air for longer than or equal to 1 hour and shorter than or equal to 30 hours. This heating step may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature.

In addition, a planarization insulating film may be formed in order to reduce surface unevenness due to the transistor 420. As the planarization insulating film, an organic material such as a polyimide resin, an acrylic resin, or a benzocyclobutene-based resin can be used. Other than such organic materials, it is also possible to use a low dielectric constant material (low-k material) or the like. Note that the planarization insulating film may be formed by stacking a plurality of insulating films formed from these materials.

The transistor described in this embodiment is not limited to the above structure. For example, as in the transistor 430 illustrated in FIG. 3, the source electrode layer 405a and the drain electrode layer 405b which are in contact with the oxide semiconductor film 409 may be formed before the silicon nitride film 407 is formed.

When the source electrode layer 405a and the drain electrode layer 405b are formed before the silicon nitride film 407 is formed, nitrogen is not added to the regions of the oxide semiconductor film 409, which overlap with the source electrode layer 405a and the drain electrode layer 405b, in the deposition of the silicon nitride film 407; thus, the resistance of the regions is not reduced, so that a region 403a and a region 403b which have a resistance similar to that of the channel formation region 403 are formed.

Figure 3:
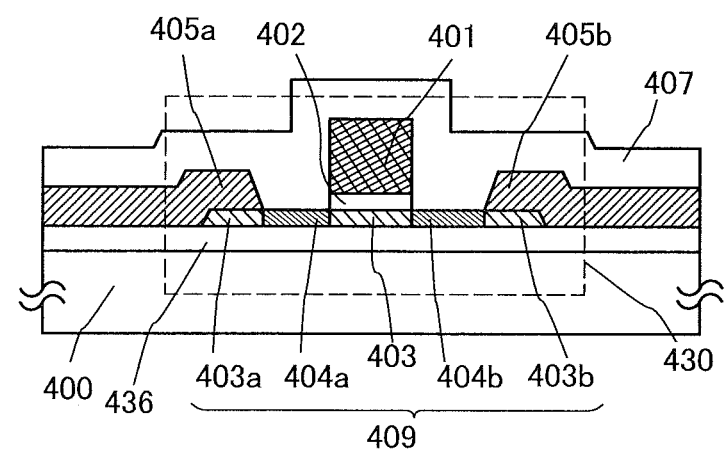
FIG. 3 is a cross-sectional view illustrating a semiconductor device according to one embodiment of the present invention.

Note that in the transistor 430 in FIG. 3, occurrence of parasitic channel is reduced because resistance of end portions of the oxide semiconductor film 409, which are in contact with the source electrode layer 405a and the drain electrode layer 405b, is not reduced. The low-resistance region 404a and the low-resistance region 404b are formed between the channel formation region 403 and the source electrode layer 405a and between the channel formation region 403 and the drain electrode layer 405b, which enables a reduction in resistance between the channel formation region 403 and the source electrode layer 405a and resistance between the channel formation region 403 and the drain electrode layer 405b; thus, the transistor 430 can have favorable electric characteristics.

Note that in order to put emphasis on the on-state characteristics of the transistor 430 and reduce resistance of the source electrode layer 405a, the drain electrode layer 405b, the region 403a, and the region 403b, an impurity element may be added to the oxide semiconductor film 409 before the source electrode layer 405a and the drain electrode layer 405b are formed. By addition of the impurity element, resistance of the region 403a and the region 403b which overlap with the source electrode layer 405a and the drain electrode layer 405b, respectively, can have lower resistance. In this case, since the impurity element is also added to the low-resistance regions 404a and 404b, the low-resistance regions 404a and 404b have much lower resistance.

This embodiment can be combined with any of the other embodiments as appropriate.

Embodiment 2

In this embodiment, transistors according to one embodiment of the present invention which are different from those of Embodiment 1 are described. Note that, in this embodiment, portions that are similar to the portions in Embodiment 1 are denoted by the same reference numerals, and detailed description thereof is omitted.

Figure 4A:
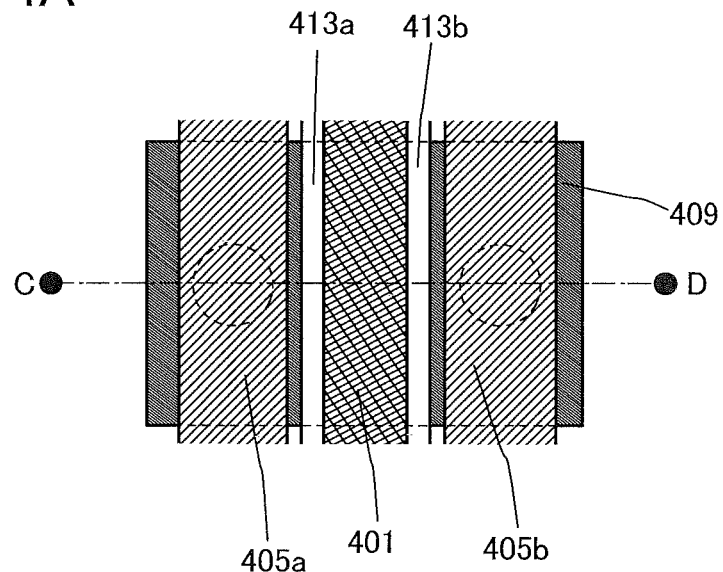
FIGS. 4A and 4B are respectively a top view and a cross-sectional view of a semiconductor device according to one embodiment of the present invention.
Figure 4B:
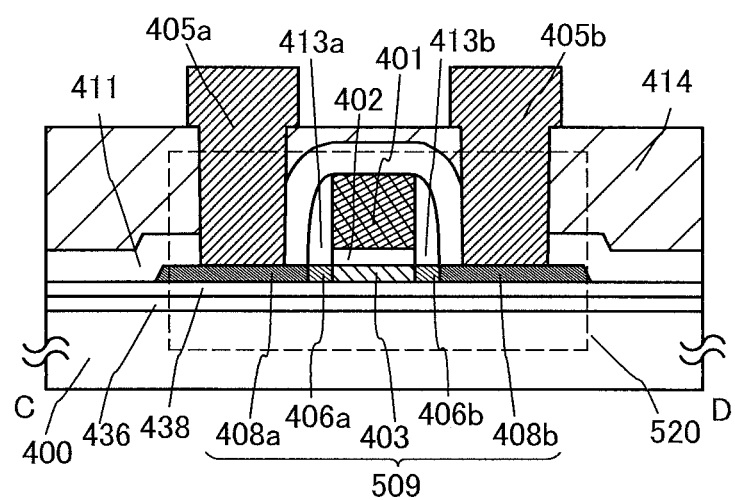

FIGS. 4A and 4B illustrate a transistor 520 according to one embodiment of the present invention. FIG. 4A is a top view of the transistor 520 and FIG. 4B is a cross-sectional view taken along dashed-dotted line C-D in FIG. 4A.

The transistor 520 includes the following: the base insulating film 436 and the base insulating film 438 over the substrate 400; an oxide semiconductor film 509 over the base insulating film 438; the gate insulating film 402 over the oxide semiconductor film 509; the gate electrode layer 401 over the gate insulating film 402; a sidewall insulating film 413a and a sidewall insulating film 413b which are in contact with side surfaces of the gate insulating film 402 and side surfaces of the gate electrode layer 401; the interlayer insulating film 411 and an interlayer insulating film 414 which are over the oxide semiconductor film 509, the gate electrode layer 401, and the sidewall insulating films 413*a* and 413*b*; and the source electrode layer 405*a* and the drain electrode layer 405*b* which are in contact with the oxide semiconductor film 509 in openings provided in the interlayer insulating films 411 and 414.

The sidewall insulating films 413*a* and 413*b* are formed using a silicon nitride film deposited using conditions similar to those of the silicon nitride film 407 described in Embodiment 1.

The oxide semiconductor film 509 includes the channel formation region 403 overlapping with the gate electrode layer 401, a first low-resistance region 406*a* and a first low-resistance region 406*b* between which the channel formation region 403 is sandwiched and which overlap with the sidewall insulating film 413*a* and the sidewall insulating film 413*b*, respectively, and a second low-resistance region 408*a* and a second low-resistance region 408*b* between which the first low-resistance regions 406*a* and 406*b* are sandwiched and which are electrically connected to the source electrode layer 405*a* and the drain electrode layer 405*b*, respectively.

The first low-resistance regions 406*a* and 406*b* and the second low-resistance regions 408*a* and 408*b* each have low resistance by addition of nitrogen caused by the deposition of a silicon nitride film to be the sidewall insulating films 413*a* and 413*b*.

Moreover, since an impurity element which reduces conductivity is added to the second low-resistance regions 408*a* and 408*b* with the gate electrode layer 401 and the sidewall insulating films 413*a* and 413*b* used as a mask, resistance of the second low-resistance regions 408*a* and 408*b* is lower than that of the first low-resistance regions 406*a* and 406*b*.

Thus, the first low-resistance regions 406*a* and 406*b* serve as lightly doped drain (LDD) regions. By providing the LDD region, off-state current can be reduced or the withstand voltage of the transistor can be increased (reliability can be improved).

Since an impurity element 421 is not added to the first low-resistance regions 406*a* and 406*b*, the first low-resistance regions 406*a* and 406*b* each are a film having a crystalline state (or including more crystal structures than amorphous structures) such as a crystalline semiconductor film or a CAAC-OS film.

By the addition of the impurity element, the ratio of amorphous components with respect to crystal components in the second low-resistance regions 408*a* and 408*b* is higher than those in the channel formation region 403 and the first low-resistance regions 406*a* and 406*b* in some cases. Since an oxide semiconductor film having an amorphous structure might be likely to absorb impurities such as hydrogen, which serve as donors, from an oxide semiconductor film having crystallinity such as a CAAC-OS film, the second low-resistance regions 408*a* and 408*b* absorb impurities (also can be expressed as "perform gettering") from the channel formation region 403 and the first low-resistance regions 406*a* and 406*b*; thus, the transistor 520 can have favorable electric characteristics. Further, the channel formation region 403 is not in contact with a region having a high concentration of an impurity element because the first low-resistance regions 406*a* and 406*b* are provided between the channel formation region 403 and the second low-resistance regions 408*a* and 408*b* which absorb an impurity element to have a high concentration of the impurity element; thus, reliability of the transistor 520 can be improved.

Next, a method for manufacturing the transistor 520 is described with reference to FIGS. 5A to 5C. Note that detailed description of portions that are similar to those in Embodiment 1 is omitted.

Figure 5A:
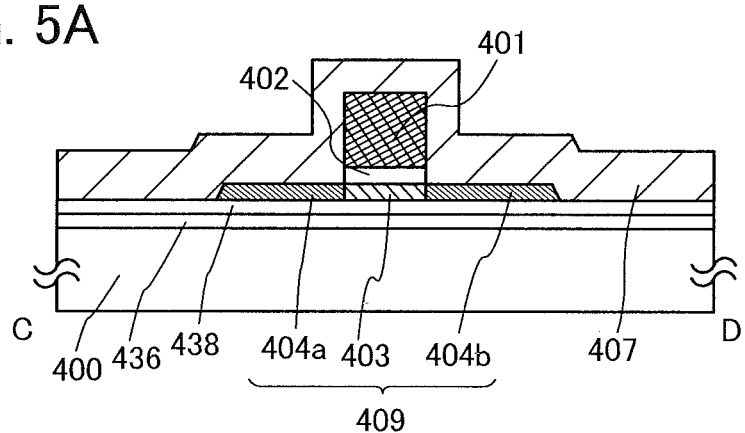
FIGS. 5A to 5C are views illustrating a method for manufacturing a semiconductor device, according to one embodiment of the present invention.
Figure 5B:
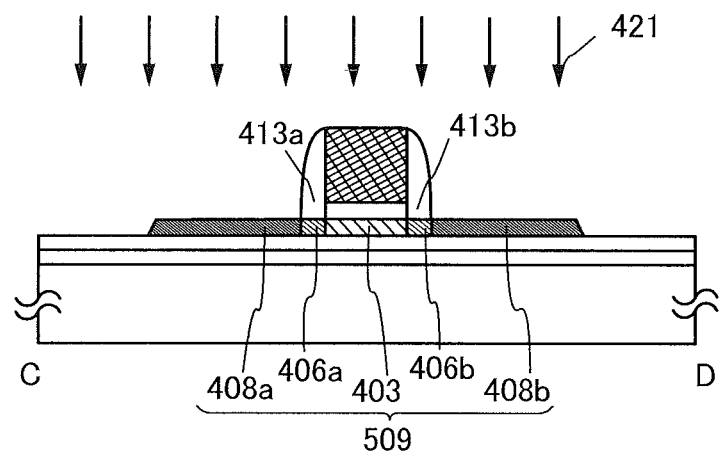

A semiconductor device illustrated in FIG. 5A corresponds to the semiconductor device illustrated in FIG. 2B. Therefore, for a method for manufacturing the semiconductor device illustrated in FIG. 5A, the description in Embodiment 1 can be referred to. Since the resistance of the oxide semiconductor film 409 is reduced by the addition of nitrogen to a region in contact with the silicon nitride film 407 in the deposition of the silicon nitride film 407, the oxide semiconductor film 409 includes, at this stage, the low-resistance regions 404*a* and 404*b* and the channel formation region 403 which is sandwiched between the low-resistance regions 404*a* and 404*b*.

Next, anisotropic etching is performed on the silicon nitride film 407, whereby part of the oxide semiconductor film 409 is exposed. The anisotropic etching is performed until the top surface of the gate electrode layer 401 is exposed. At the stage at which the gate electrode layer 401 is exposed by the anisotropic etching, the silicon nitride film remains on side portions of the gate electrode layer 401 and the gate insulating film 402. Thus, by stopping etching at this stage, the sidewall insulating films 413*a* and 413*b* can be formed in a self-aligned manner without using a mask. By forming the sidewall insulating films 413*a* and 413*b* without using a mask, the number of masks and manufacturing cost can be reduced.

Next, the impurity element 421 is added to the oxide semiconductor film 409 using the gate electrode layer 401 and the sidewall insulating films 413*a* and 413*b* as a mask. An ion implantation method, an ion doping method, or the like can be used as a method for adding the impurity element 421.

Phosphorus, boron, nitrogen, arsenic, argon, aluminum, a molecular ion containing any of these elements, or the like can be used as the impurity element to be added. The dosage of such an element is preferably $1\times10^{13}$ ions/cm$^2$ to $5\times10^{16}$ ions/cm$^2$. When phosphorus is added as the impurity element, the acceleration voltage is preferably 0.5 kV to 80 kV.

The treatment for adding the impurity element to the oxide semiconductor film 409 may be performed plural times. In the case where the treatment for adding the impurity element to the oxide semiconductor film 409 is performed plural times, the kind of the impurity element may be the same in the plural treatments or different in every treatment.

By adding the impurity element 421, resistance of exposed regions of the low-resistance regions 404*a* and 404*b* (regions which do not overlap with any of the gate electrode layer 401 and the sidewall insulating films 413*a* and 413*b*) is reduced. Thus, the oxide semiconductor film 509 includes the channel formation region 403, the first low-resistance regions 406*a* and 406*b* whose resistance is reduced by the addition of nitrogen in the deposition of the silicon nitride film, and the second low-resistance regions 408*a* and 408*b* whose resistance is reduced by the addition of nitrogen in the deposition of the silicon nitride film and treatment of adding the impurity element 421 (see FIG. 5B).

The first low-resistance regions 406*a* and 406*b* and the second low-resistance regions 408*a* and 408*b* are regions whose resistance is reduced by the addition of nitrogen in the deposition of the silicon nitride film 407. In addition, the second low-resistance regions 408*a* and 408*b* are regions which are made to have lower resistance than the first low-resistance regions 406a and 406b by the addition of the impurity element 421.

Note that in the addition of the impurity element 421, acceleration voltage of the impurity element may be adjusted so that the impurity element is added to regions (the first low-resistance regions 406a and 406b) of the oxide semiconductor film 509, which overlap with the sidewall insulating films 413a and 413b, through the sidewall insulating films 413a and 413b. The impurity element is also added to the first low-resistance regions 406a and 406b, whereby resistance of the first low-resistance regions 406a and 406b can be further reduced. In the case where the impurity element is also added to the first low-resistance regions 406a and 406b, more impurity elements may be added to the second low-resistance regions 408a and 408b than to the first low-resistance regions 406a and 406b.

Next, the interlayer insulating films 411 and 414 are formed over the oxide semiconductor film 509, the sidewall insulating films 413a and 413b, and the gate electrode layer 401. As each of the interlayer insulating films 411 and 414, a single layer or a stack of one or more inorganic insulating films such as a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used. The interlayer insulating films 411 and 414 may be different films or the same film. Here, the interlayer insulating film 411 is a silicon oxide film containing added oxygen in excess of the stoichiometric composition to supply oxygen to the oxide semiconductor film 509 and the interlayer insulating film 414 is a silicon nitride film which has a property of blocking entry of impurities such as hydrogen and water from the outside into the oxide semiconductor film.

Figure 5C:
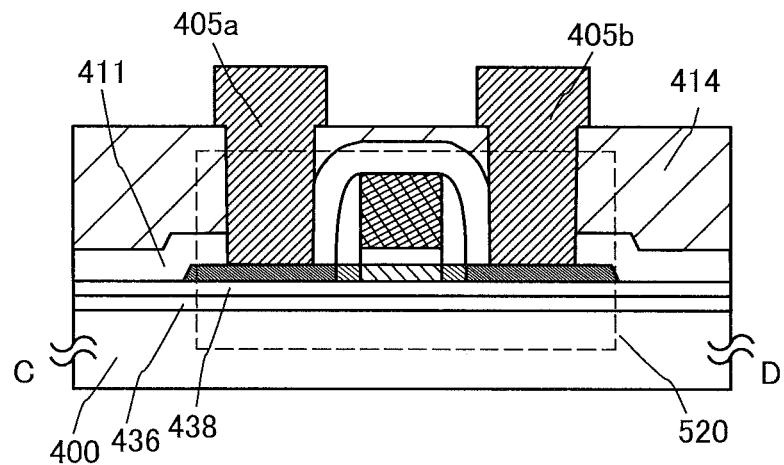

Then, openings reaching the second low-resistance regions 408a and 408b are formed in the interlayer insulating films 411 and 414 and the source electrode layer 405a and the drain electrode layer 405b are formed in the openings using a conductive material (see FIG. 5C).

The source electrode layer 405a and the drain electrode layer 405b are in contact with the oxide semiconductor film 509 in the second low-resistance regions 408a and 408b; thus, contact resistance between the oxide semiconductor film 509 and the source electrode layer 405a and contact resistance between the oxide semiconductor film 509 and the drain electrode layer 405b can be reduced.

Further, since the first low-resistance regions 406a and 406b serve as LDD regions, off-state current can be reduced or the withstand voltage of the transistor can be increased (reliability can be improved).

Through the above-described steps, the transistor 520 can be manufactured.

In the transistor described in this embodiment, nitrogen is diffused into the regions of the oxide semiconductor film, which are in contact with the silicon nitride film, by formation of the silicon nitride film over the oxide semiconductor film, the gate insulating film, and the gate electrode layer, whereby low-resistance regions are formed. In the low-resistance regions, the oxide semiconductor film is electrically connected to the source electrode layer and the drain electrode layer; thus, contact resistance between the source electrode layer and the oxide semiconductor film and contact resistance between the drain electrode layer and the oxide semiconductor film can be reduced.

Further, the silicon nitride film has a reduced hydrogen concentration and a small number of released hydrogen molecules. Thus, impurities such as hydrogen and moisture, which cause degradation of the oxide semiconductor film, can be prevented from entering the oxide semiconductor film from the silicon nitride film. In addition, since the silicon nitride film has a property of blocking entry of hydrogen and moisture from the outside, entry of impurities such as hydrogen and moisture from the outside can be prevented. Accordingly, a semiconductor device which has stable electric characteristics and high reliability can be provided.

Moreover, in the semiconductor device described in this embodiment, LDD regions can be formed in a self-aligned manner by the addition of the impurity element with the gate electrode layer and the sidewall insulating films used as a mask. By providing the LDD region, off-state current of the transistor can be reduced or the withstand voltage of the transistor can be increased (reliability can be improved).

Figure 6A:
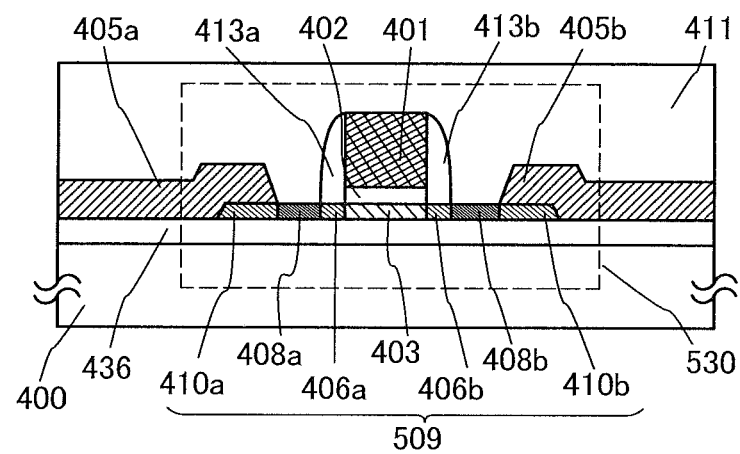
FIGS. 6A and 6B are cross-sectional views illustrating a semiconductor device according to one embodiment of the present invention.

The transistor described in this embodiment is not limited to the above structure. For example, as in a transistor 530 illustrated in FIG. 6A, the oxide semiconductor film 509 may be in contact with the source electrode layer 405a and the drain electrode layer 405b without the openings in the interlayer insulating film 411. An insulating film 412 may be formed over the gate electrode layer 401.

A method for manufacturing the transistor 530 is as follows. First, an oxide semiconductor film is formed, the gate insulating film 402 and the gate electrode layer 401 are formed over the oxide semiconductor film 509, nitrogen is added to the oxide semiconductor film 509 by depositing the silicon nitride film in order to reduce resistance, and anisotropic etching is performed on the silicon nitride film, whereby the sidewall insulating films 413a and 413b are formed. After that, the source electrode layer 405a and the drain electrode layer 405b are formed, and the impurity element is added to the oxide semiconductor film 509 with the gate electrode layer 401, the sidewall insulating films 413a and 413b, the source electrode layer 405a, and the drain electrode layer 405b used as masks.

Thus, the oxide semiconductor film 509 of the transistor 530 includes the following: the channel formation region 403 overlapping with the gate electrode layer 401; the first low-resistance regions 406a and 406b between which the channel formation region 403 is sandwiched and which overlap with the sidewall insulating films 413a and 413b; the second low-resistance regions 408a and 408b between which the first low-resistance regions 406a and 406b are sandwiched and which have lower resistance than the first low-resistance regions 406a and 406b by treatment of adding the impurity element; and a third low-resistance region 410a and a third low-resistance region 410b between which the second low-resistance regions 408a and 408b are sandwiched and which are in contact with the source electrode layer 405a and the drain electrode layer 405b.

In the transistor 530, occurrence of parasitic channel is reduced because resistance of end portions of the oxide semiconductor film 509, which are electrically connected to the source electrode layer 405a and the drain electrode layer 405b, is not reduced. When emphasis is put on the on-state characteristics of the transistor 530, an impurity element may be added before the source electrode layer 405a and the drain electrode layer 405b are formed, so that the third low-resistance regions 410a and 410b which overlap with the source electrode layer 405a and the drain electrode layer 405b also include an impurity element.

Figure 6B:
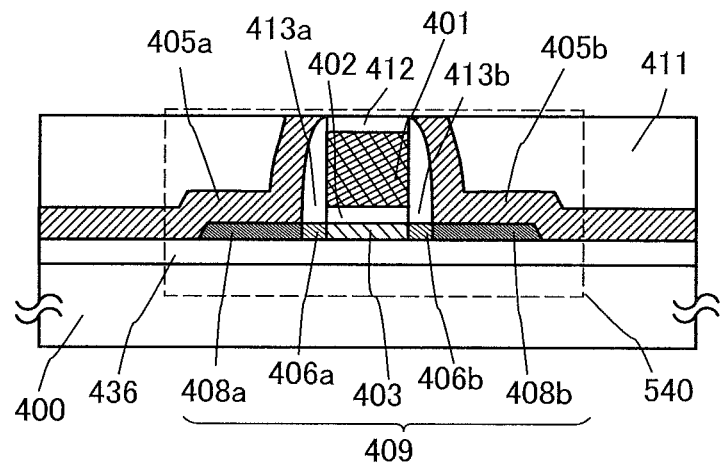

Further, a semiconductor device of another mode of this embodiment may have, as in a transistor 540 illustrated in FIG. 6B, a structure in which the insulating film 412 is formed over the gate electrode layer 401 and the source electrode layer 405a and the drain electrode layer 405b are formed so as to be in contact with side surfaces of the sidewall insulating films 413a and 413b and to cover the oxide semiconductor film 409.

As a method for manufacturing the transistor 540, after the sidewall insulating films 413a and 413b are formed by a method similar to that of the transistor 520, a conductive film to be the source electrode layer 405a and the drain electrode layer 405b and an insulating film to be the interlayer insulating film 411 are formed over the oxide semiconductor film 509, the gate electrode layer 401, and the sidewall insulating films 413a and 413b. Regions of the conductive film and the insulating film, which overlap with the gate electrode layer 401 are removed and thus, the conductive film is divided, so that the source electrode layer 405a and the drain electrode layer 405b can be formed in a self-aligned manner.

The conductive film and the insulating film can be removed by chemical mechanical polishing treatment, anisotropic etching, or the like.

With the insulating film 412 over the gate electrode layer 401, insulation between the gate electrode layer 401 and the source electrode layer 405a and insulation between the gate electrode layer 401 and the drain electrode layer 405b can be ensured.

This embodiment can be combined with any of the other embodiments as appropriate.

Embodiment 3

In this embodiment, an example of a semiconductor device including any of the transistors described in Embodiments 1 and 2 is described with reference to FIG. 7 and FIGS. 8A and 8B.

Figure 7:
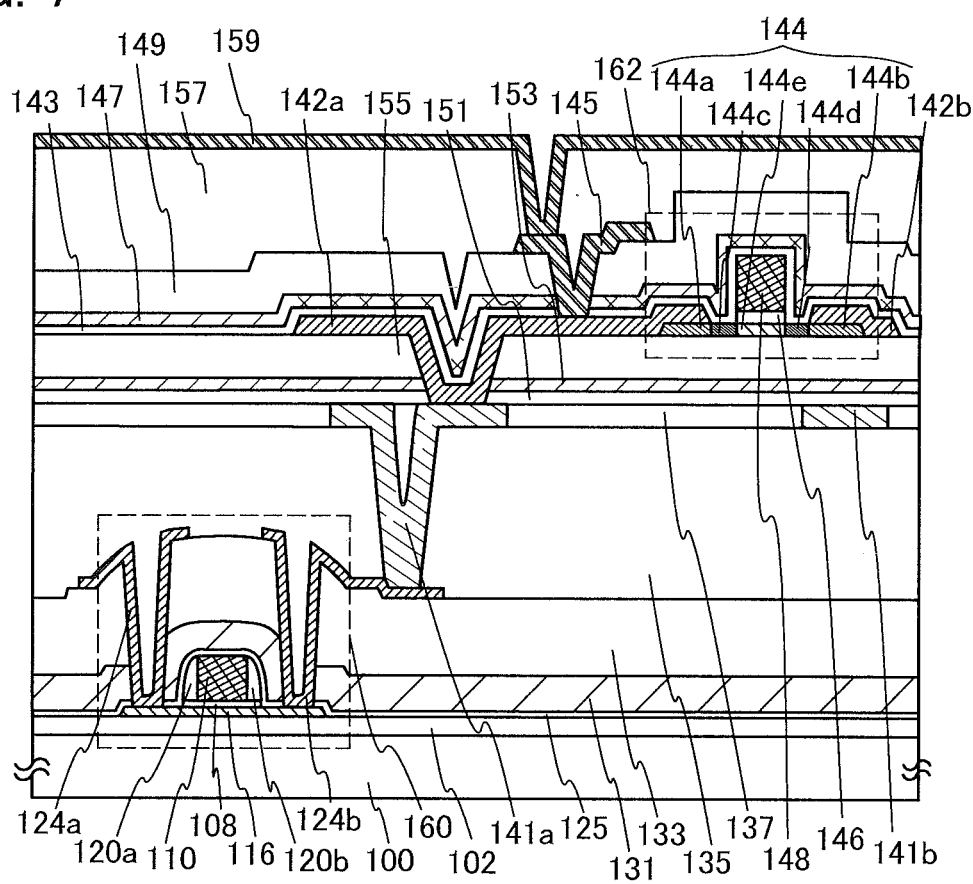
FIG. 7 is a cross-sectional view illustrating a semiconductor device according to one embodiment of the present invention.

FIG. 7 is a cross-sectional view of part of a semiconductor device described in this embodiment. The cross-sectional view illustrated in FIG. 7 is an example, and the structure of the semiconductor device described in this embodiment is not limited thereto.

The semiconductor device illustrated in FIG. 7 includes a transistor 160 including a first semiconductor material in a lower portion, and a transistor 162 including a second semiconductor material in an upper portion. The transistor 162 can have a structure similar to that of any of the transistors described in Embodiments 1 and 2. Here, as the transistor 162, the transistor described in Embodiment 1 is used.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics and thus allows a reduction in power consumption.

The transistor 160 in FIG. 7 includes the following: a base insulating film 102 over a substrate 100 including a semiconductor material (e.g., silicon); a semiconductor layer 116 over the base insulating film 102; a gate insulating film 108 over the semiconductor layer 116; a gate electrode layer 110 over the gate insulating film 108; a sidewall insulating film 120a and a sidewall insulating film 120b which are over the gate insulating film 108 and in contact with side surfaces of the gate electrode layer 110; a stack of an insulating film 125, an insulating film 131, and an insulating film 133 which covers the semiconductor layer 116, the gate insulating film 108, the gate electrode layer 110, and the sidewall insulating films 120a and 120b; and a source electrode layer 124a and a drain electrode layer 124b which are in contact with the semiconductor layer 116 through openings provided in the insulating film 125, the insulating film 131, and the insulating film 133.

In order to achieve high integration, the transistor 160 preferably has a structure in which the sidewall insulating films 120a and 120b are not provided. On the other hand, in the case where emphasis is put on characteristics of the transistor 160, the sidewall insulating films 120a and 120b are preferably provided as illustrated in FIG. 7.

An insulating film 135 is provided over the transistor 160. An insulating film 137 is provided over the insulating film 135, and a conductive layer 141a and a conductive layer 141b are provided in the insulating film 137. The conductive layer 141a is electrically connected to the drain electrode layer 124b of the transistor 160 through an opening provided in the insulating film 135.

An insulating film 151, an insulating film 153, and an insulating film 155 are provided over the insulating film 137. The insulating films 151 and 153 each are preferably have a blocking property so that an impurity caused by the transistor 160 is not added to the transistor 162. For example, the insulating film 151 may contain silicon oxide and the insulating film 153 may contain silicon nitride. The insulating film 155 improves planarity of an oxide semiconductor film 144 to be formed later and supplies oxygen to the oxide semiconductor film. Thus, as the insulating film 155, it is preferable to use a silicon oxide film or the like which contains oxygen in excess of the stoichiometric composition and whose planarity is improved by CMP treatment or the like.

The transistor 162 is formed over the insulating film 155. The transistor 162 is the transistor including an oxide semiconductor described in Embodiment 1. Resistance of the oxide semiconductor film 144 included in the transistor 162 is reduced by treatment of adding an impurity element with a gate electrode layer 148 used as a mask and deposition of a silicon nitride film 143 over the oxide semiconductor film 144. Consequently, the oxide semiconductor film 144 includes a low-resistance region 144a, a low-resistance region 144b, a low-resistance region 144c, a low-resistance region 144d, and a channel formation region 144e. The treatment of adding an impurity element is performed between the formation of the gate electrode layer 148 and the deposition of the silicon nitride film 143.

The impurity element is added to the low-resistance regions 144a to 144d with the gate electrode layer 148 used as a mask. Accordingly, concentration of the impurity element in each of the low-resistance regions 144a to 144d is higher than that in the channel formation region 144e. Since carrier density in the oxide semiconductor film 144 is increased by increase in the concentration of the impurity element, favorable ohmic contact can be obtained between a wiring layer and the oxide semiconductor film, so that on-state current and field-effect mobility of the transistor are improved.

In addition, resistance of the low-resistance regions 144c and 144d is reduced because nitrogen is added to the low-resistance regions 144c and 144d by deposition of the silicon nitride film 143 over the oxide semiconductor film 144. Accordingly, the low-resistance regions 144c and 144d have lower resistance than the low-resistance regions 144a and 144b.

In the transistor 162, nitrogen is added to the oxide semiconductor film by deposition of the silicon nitride film in contact with the oxide semiconductor film, so that the low-resistance regions 144c and 144d can be formed in the oxide semiconductor film 144. Consequently, a transistor having excellent on-state characteristics and favorable electric characteristics can be obtained, which enables high-speed response and high-speed operation of a semiconductor device.

Further, the silicon nitride film has a reduced hydrogen concentration and has a property of blocking entry of hydrogen and moisture from the outside. Thus, entry of impurities such as water and hydrogen, which causes degradation of the oxide semiconductor film, can be prevented; accordingly, a semiconductor device having stable electric characteristics and high reliability can be provided.

The transistor 162 includes the following: the above-described oxide semiconductor film 144; a gate insulating film 146 over the oxide semiconductor film 144; the gate electrode layer 148 over the gate insulating film 146; a source electrode layer 142a and a drain electrode layer 142b which are in contact with the low-resistance region 144a and the low-resistance region 144b of the oxide semiconductor film 144, respectively; and the silicon nitride film 143 covering the oxide semiconductor film 144, the source electrode layer 142a, the drain electrode layer 142b, the gate insulating film 146, and the gate electrode layer 148. The source electrode layer 142a is electrically connected to the conductive layer 141a through an opening provided in the insulating film 151, the insulating film 153, and the insulating film 155.

A stack of an insulating film 147 and an insulating film 149 is provided over the transistor 162. As each of the insulating films 147 and 149, an inorganic insulating film such as a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, or an aluminum nitride oxide film can be used. The insulating films 147 and 149 may be the same film or different films.

Over the insulating films 147 and 149, a wiring layer 145 electrically connected to the source electrode layer 142a through an opening provided in the insulating films 147 and 149 is provided. An insulating film 157 is provided over the wiring layer 145, and a wiring layer 159 electrically connected to the wiring layer 145 through an opening provided in the insulating film 157 is provided over the insulating film 157.

Figure 8A:
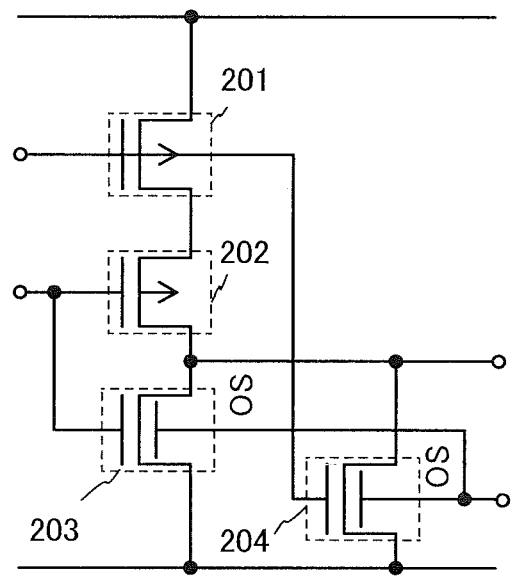
FIGS. 8A and 8B are circuit diagrams each illustrating a semiconductor device according to one embodiment of the present invention.
Figure 8B:
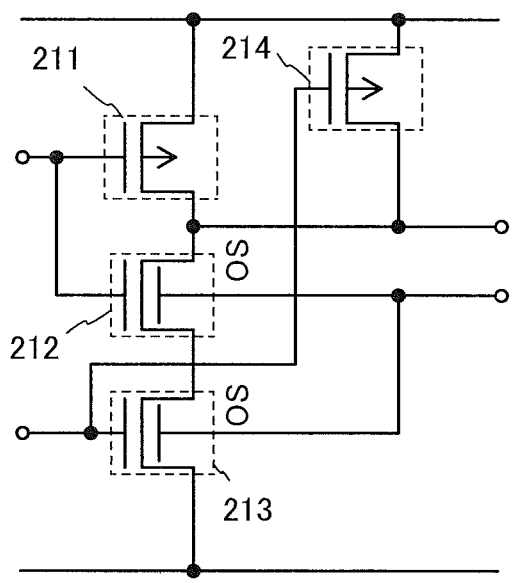

As examples of the semiconductor device including the transistor described in this specification, a NOR circuit and a NAND circuit which are logic circuits are illustrated in FIGS. 8A and 8B. FIG. 8A shows the NOR circuit, and FIG. 8B shows the NAND circuit.

In the NOR circuit and the NAND circuit illustrated in FIGS. 8A and 8B, a transistor 201, a transistor 202, a transistor 211, and a transistor 214 each are a p-channel transistor and have a structure similar to that of the transistor 160 in FIG. 7. A transistor 203, a transistor 204, a transistor 212, and a transistor 213 each are an n-channel transistor and have a structure similar to that of the transistor 162 in FIG. 7 or that of any of the transistors described in Embodiments 1 and 2.

In the semiconductor device described in this embodiment, the transistor in which an oxide semiconductor is used for the channel formation region and which has extremely small off-state current is employed as the transistor 162; therefore, power consumption can be sufficiently reduced. Further, with any of the transistors described in Embodiments 1 and 2, contact resistance between the oxide semiconductor film and the source electrode layer and contact resistance between the oxide semiconductor film and the drain electrode layer are reduced; thus, excellent on-state characteristics are obtained, which enables high-speed response and high-speed operation of the semiconductor device.

Further, with a stack of semiconductor elements using different semiconductor materials, a miniaturized and highly integrated semiconductor device with stable electric characteristics and a method for manufacturing the semiconductor device can be provided.

The structures, methods, and the like described in this embodiment can be combined as appropriate with any of the other structures, methods, and the like described in the other embodiments Embodiment 4

In this embodiment, an example of a semiconductor device (memory device) which includes the transistor described in this specification, which can hold stored data even when not powered, and which has an unlimited number of write cycles is described with reference to drawings.

Figure 9A:
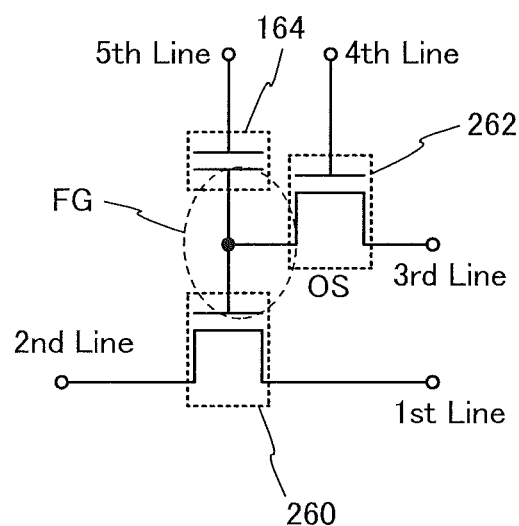
FIGS. 9A to 9C are circuit diagrams and a perspective view illustrating a semiconductor device according to one embodiment of the present invention.

FIG. 9A is a circuit diagram illustrating the semiconductor device of this embodiment.

A transistor 260 illustrated in FIG. 9A can have a structure similar to that of the transistor 160 illustrated in FIG. 7 and easily operates at high speed. Further, a transistor 262 can have a structure similar to that of the transistor 162 illustrated in FIG. 7 or that of any of the transistors described in Embodiments 1 and 2 and enables charge to be held for a long time owing to its characteristics.

Although all the transistors are n-channel transistors here, p-channel transistors can be used as the transistors used for the semiconductor device described in this embodiment.

In FIG. 9A, a first wiring (1st Line) is electrically connected to a source electrode layer of the transistor 260, and a second wiring (2nd Line) is electrically connected to a drain electrode layer of the transistor 260. A third wiring (3rd Line) is electrically connected to one of the source electrode layer and the drain electrode layer of the transistor 262, and a fourth wiring (4th Line) is electrically connected to a gate electrode layer of the transistor 262. A gate electrode layer of the transistor 260 and the other of the source electrode layer and the drain electrode layer of the transistor 262 are electrically connected to one electrode of the capacitor 164. A fifth wiring (5th Line) is electrically connected to the other electrode of the capacitor 164.

The semiconductor device illustrated in FIG. 9A utilizes a characteristic in which the potential of the gate electrode layer of the transistor 260 can be held, and thus enables data writing, holding, and reading as follows.

Writing and holding of data will be described. First, the potential of the fourth wiring is set to a potential at which the transistor 262 is turned on, so that the transistor 262 is turned on. Accordingly, the potential of the third wiring is supplied to the gate electrode layer of the transistor 260 and to the capacitor 164. That is, predetermined charge is supplied to the gate electrode layer of the transistor 260 (writing). Here, charge for supplying either of two different potential levels (hereinafter referred to as charge corresponding to a low level and charge corresponding to a high level) is given.

After that, the potential of the fourth wiring is set to a potential at which the transistor 262 is turned off, so that the transistor 262 is turned off. Thus, the charge given to the gate electrode layer of the transistor 260 is held (holding).

Since the off-state current of the transistor 262 is extremely low, the charge of the gate electrode layer of the transistor 260 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 260. This is because in general, when the transistor 260 is an n-channel transistor, an apparent threshold voltage $V_{th\_H}$ in the case where the charge corresponding to the high level is given to the gate electrode layer of the transistor 260 is lower than an apparent threshold voltage $V_{th\_L}$ in the case where the charge corresponding to the low level is given to the gate electrode layer of the transistor 260. Here, an apparent threshold voltage refers to the potential of the fifth line, which is needed to turn on the transistor 260. Thus, the potential of the fifth wiring is set to a potential $V_0$ which is between $V_{th\_H}$ and $V_{th\_L}$, whereby charge given to the gate electrode layer of the transistor 260 can be determined. For example, in the case where the charge corresponding to the high level is given in writing, when the potential of the fifth wiring is set to $V_0$ ($>V_{th\_H}$), the transistor 260 is turned on. In the case where the charge corresponding to the low level is given in writing, even when the potential of the fifth wiring is set to $V_0$ ($<V_{th\_L}$), the transistor 260 remains in an off state. Therefore, the stored data can be read by the potential of the second line.

Note that in the case where memory cells are arrayed to be used, only data of desired memory cells needs to be read. In the case where such reading is not performed, a potential at which the transistor 260 is turned off regardless of the state of the gate electrode layer of the transistor 260, that is, a potential smaller than $V_{th\_H}$ may be given to the fifth wiring. Alternatively, a potential at which the transistor 260 is turned on regardless of the state of the gate electrode layer, that is, a potential higher than $V_{th\_L}$ may be given to the fifth wiring.

Figure 9B:
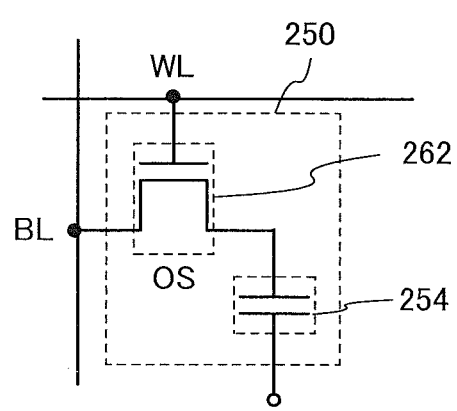
Figure 9C:
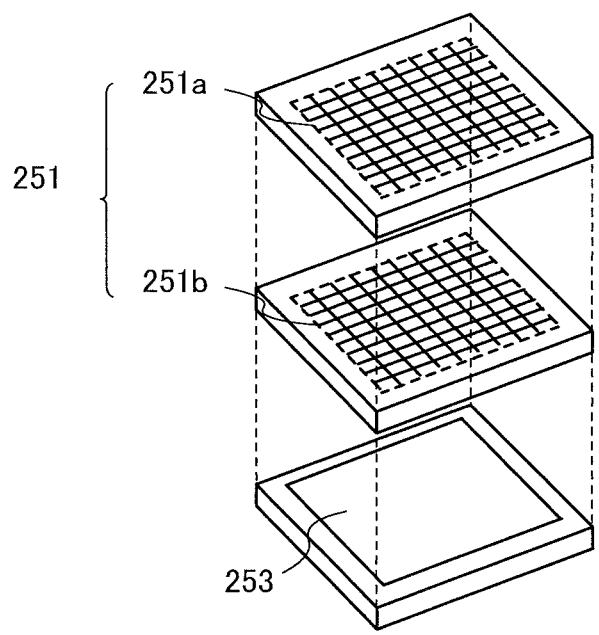

FIG. 9B illustrates an example of one embodiment of a structure of a memory device which is different from that in FIG. 9A. FIG. 9B illustrates an example of a circuit configuration of a semiconductor device, and FIG. 9C is a conceptual diagram illustrating an example of a semiconductor device. First, the semiconductor device illustrated in FIG. 9B will be described, and then, the semiconductor device illustrated in FIG. 9C will be described.

In the semiconductor device illustrated in FIG. 9B, a bit line BL is electrically connected to the source electrode layer or the drain electrode layer of the transistor 262, a word line WL is electrically connected to the gate electrode layer of the transistor 262, and the source electrode layer or the drain electrode layer of the transistor 262 is electrically connected to a first terminal of a capacitor 254.

Here, the transistor 262 including an oxide semiconductor has extremely low off-state current. For that reason, a potential of the first terminal of the capacitor 254 (or a charge accumulated in the capacitor 254) can be held for an extremely long time by turning off the transistor 262.

Next, writing and holding of data in the semiconductor device (a memory cell 250) illustrated in FIG. 9B will be described.

First, the potential of the word line WL is set to a potential at which the transistor 262 is turned on, and the transistor 262 is turned on. Accordingly, the potential of the bit line BL is supplied to the first terminal of the capacitor 254 (writing). After that, the potential of the word line WL is set to a potential at which the transistor 262 is turned off, so that the transistor 262 is turned off. Thus, the potential of the first terminal of the capacitor 254 is held (holding).

Because the off-state current of the transistor 262 is extremely small, the potential of the first terminal of the capacitor 254 (or a charge accumulated in the capacitor) can be held for an extremely long period.

Next, reading of data will be described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is represented by $(C_B \cdot V_{B0} + C \cdot V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \cdot V_{B0} + C \cdot V_1)/(C_B + C)$) is higher than the potential of the bit line BL in the case of holding the potential $V_0$ ($=(C_B \cdot V_{B0} + C \cdot V_0)/(C_B + C)$).

Then, by comparing the potential of the bit line BL with a predetermined potential, data can be read.

As described above, the semiconductor device illustrated in FIG. 9B can hold charge that is accumulated in the capacitor 254 for a long time because the amount of the off-state current of the transistor 262 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 9C will be described.

The semiconductor device illustrated in FIG. 9C includes memory cell arrays 251a and 251b including a plurality of memory cells 250 illustrated in FIG. 9B as memory circuits in an upper portion, and a peripheral circuit 253 in a lower portion which is necessary for operating a memory cell array 251 (the memory cell arrays 251a and 251b). Note that the peripheral circuit 253 is electrically connected to the memory cell array 251.

In the structure illustrated in FIG. 9C, the peripheral circuit 253 can be provided directly under the memory cell array 251 (the memory cell arrays 251a and 251b). Thus, the size of the semiconductor device can be reduced.

It is preferable that a semiconductor material of the transistor provided in the peripheral circuit 253 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which need to operate at high speed can be favorably realized by the transistor.

Note that FIG. 9C illustrates, as an example, the semiconductor device in which two memory cell arrays 251 (the memory cell arrays 251a and 251b) are stacked; however, the number of memory cell arrays to be stacked is not limited thereto. Three or more memory cell arrays may be stacked.

Figure 10:
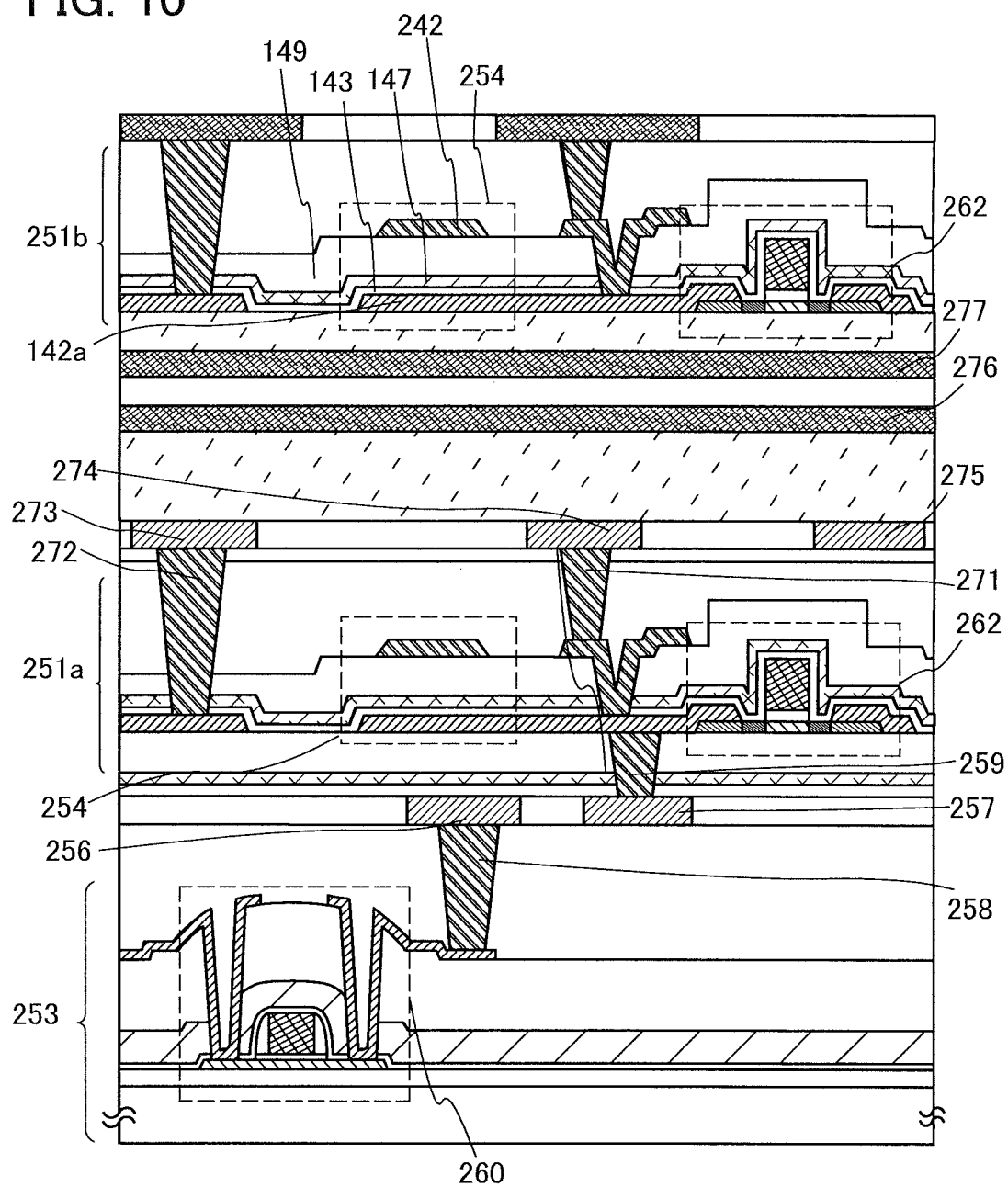
FIG. 10 is a cross-sectional view illustrating a semiconductor device according to one embodiment of the present invention.

FIG. 10 is an example of a cross-sectional view of the semiconductor device illustrated in FIG. 9C. In the cross-sectional view illustrated in FIG. 10, the transistor 260 which is included in the peripheral circuit 253 and the transistor 262 and the capacitor 254 which are included in each of the memory cell arrays 251a and 251b are illustrated.

The transistors 260 and 262 can have structures similar to those of the transistors 160 and 162 illustrated in FIG. 7, respectively; thus, detailed description thereof is omitted.

The capacitor 254 included in each of the memory cell arrays 251a and 251b includes the source electrode layer 142a of the transistor 262, the silicon nitride film 143, the insulating film 147, the insulating film 149, and a conductive layer 242. In other words, the source electrode layer 142a of the transistor 262 functions as one electrode of the capacitor 254, the silicon nitride film 143, the insulating film 147, and the insulating film 149 function as a dielectric of the capacitor 254, and the conductive layer 242 functions as the other electrode of the capacitor 254.

Wiring layers for electrically connecting the peripheral circuit 253 and the memory cell array 251a are provided between the peripheral circuit 253 and the memory cell array 251a. A wiring layer 258 electrically connects a drain electrode layer of the transistor 260 included in the peripheral circuit 253 and the conductive layer 256, and a conductive layer 257 formed in the same step as the conductive layer 256 is electrically connected to a source electrode layer of the transistor 262 included in the memory cell array 251a through a wiring layer 259.

Similarly, wiring layers for electrically connecting the memory cell arrays 251a and 251b are provided between the memory cell arrays 251a and 251b. Although detailed description is omitted, the memory cell arrays 251a and 251b are electrically connected to each other through a wiring layer 271, a wiring layer 272, a conductive layer 273, a conductive layer 274, a conductive layer 275, a conductive layer 276, and a conductive layer 277.

When a transistor including an oxide semiconductor in a channel formation region is used as the transistor 262, stored data can be held for a long time. In other words, power consumption can be sufficiently reduced because a semiconductor device in which refresh operation is unnecessary or the frequency of refresh operation is extremely low can be provided.

As the transistor 262, any of the transistors described in Embodiments 1 and 2 can be used. In the transistor 262, nitrogen is added to an oxide semiconductor film by depositing a silicon nitride film over and in contact with the oxide semiconductor film, so that low-resistance regions can be formed in the oxide semiconductor film 144. Thus, a transistor with excellent on-state characteristics and favorable electric characteristics can be provided, which enables high-speed response and high-speed operation of a semiconductor device.

Embodiment 5

In this embodiment, examples of application of the semiconductor device described in any of the above embodiments to electronic devices such as a mobile phone, a smartphone, or an e-book reader will be described with reference to FIGS. 11A and 11B, FIG. 12, FIG. 13, and FIG. 14.

In electronic devices such as a mobile phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 11A:
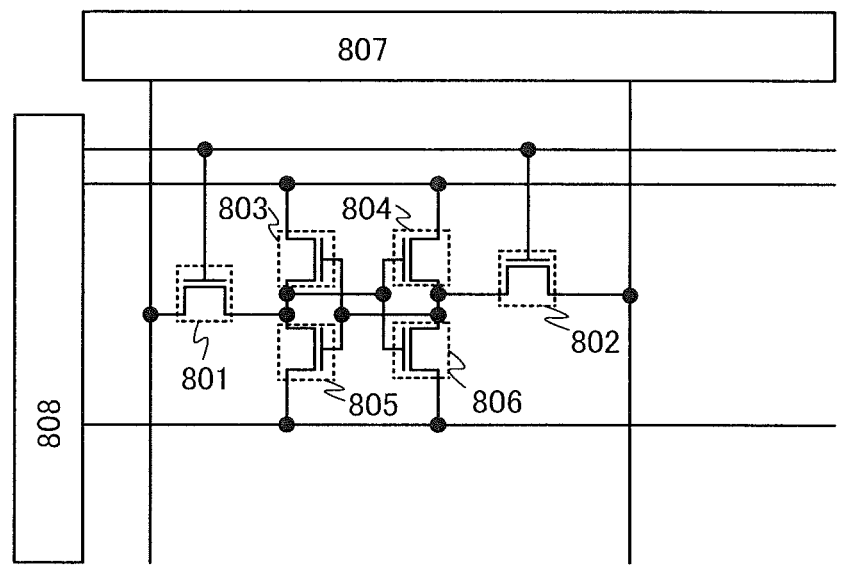
FIGS. 11A and 11B are circuit diagrams each illustrating a semiconductor device according to one embodiment of the present invention.

In a normal SRAM, as illustrated in FIG. 11A, one memory cell includes six transistors, which are a transistor 801, a transistor 802, a transistor 803, a transistor 804, a transistor 805, and a transistor 806, and they are driven by an X decoder 807 and a Y decoder 808. A pair of the transistors 803 and 805 and a pair of the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, the price per bit of an SRAM is the highest among a variety of memory devices.

Figure 11B:
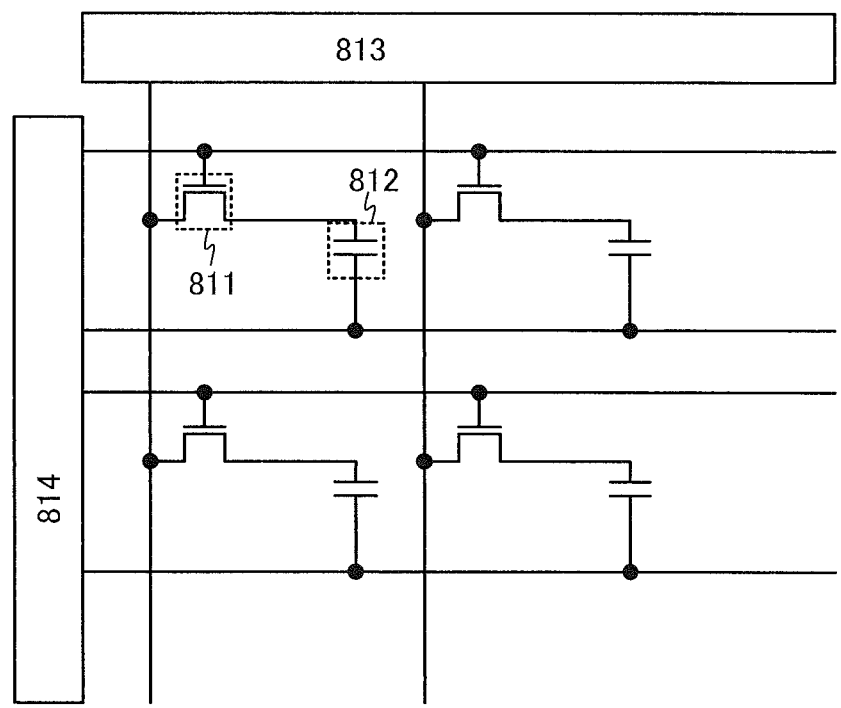

On the other hand, as illustrated in FIG. 11B, a memory cell in a DRAM includes a transistor 811 and a storage capacitor 812, and is driven by an X decoder 813 and a Y decoder 814. One cell includes one transistor and one capacitor and has a small area. The area of a memory cell in a DRAM is generally less than or equal to 10 $F^2$. Note that the DRAM needs to be refreshed periodically and consumes electric power even when a rewriting operation is not performed.

However, the area of the memory cell of the semiconductor device described in any of the above embodiments is about 10 $F^2$ and frequent refreshing is not needed. Therefore, the area of the memory cell can be reduced, which results in a reduction in power consumption. Further, with the semiconductor device described in any of the above embodiments, a semiconductor device which is hardly affected by entry of hydrogen, water, and the like from the outside and has high reliability can be provided.

Figure 12:
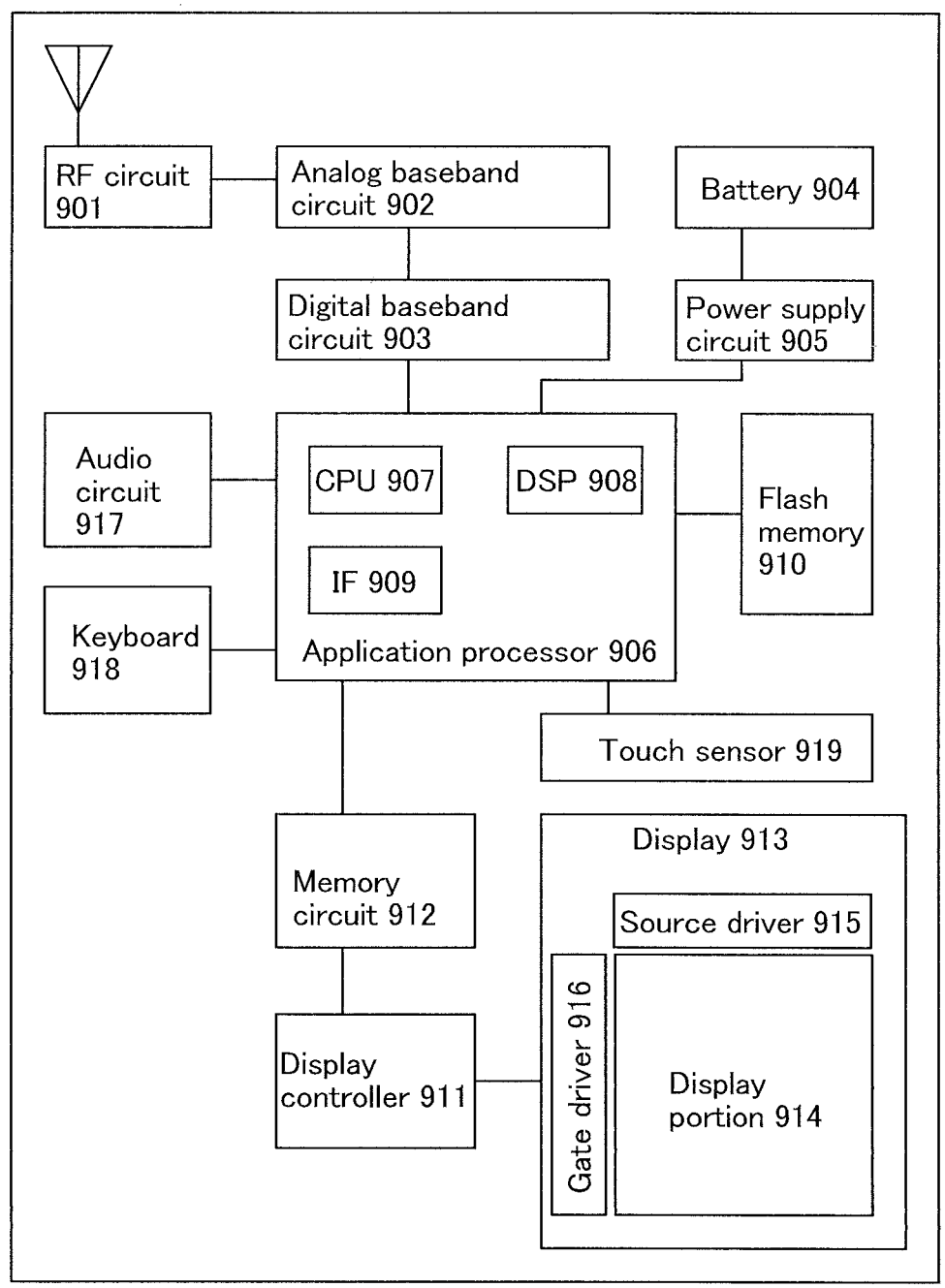
FIG. 12 is a block diagram of a semiconductor device according to one embodiment of the present invention.

FIG. 12 is a block diagram of an electronic device. An electronic device illustrated in FIG. 12 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 13:
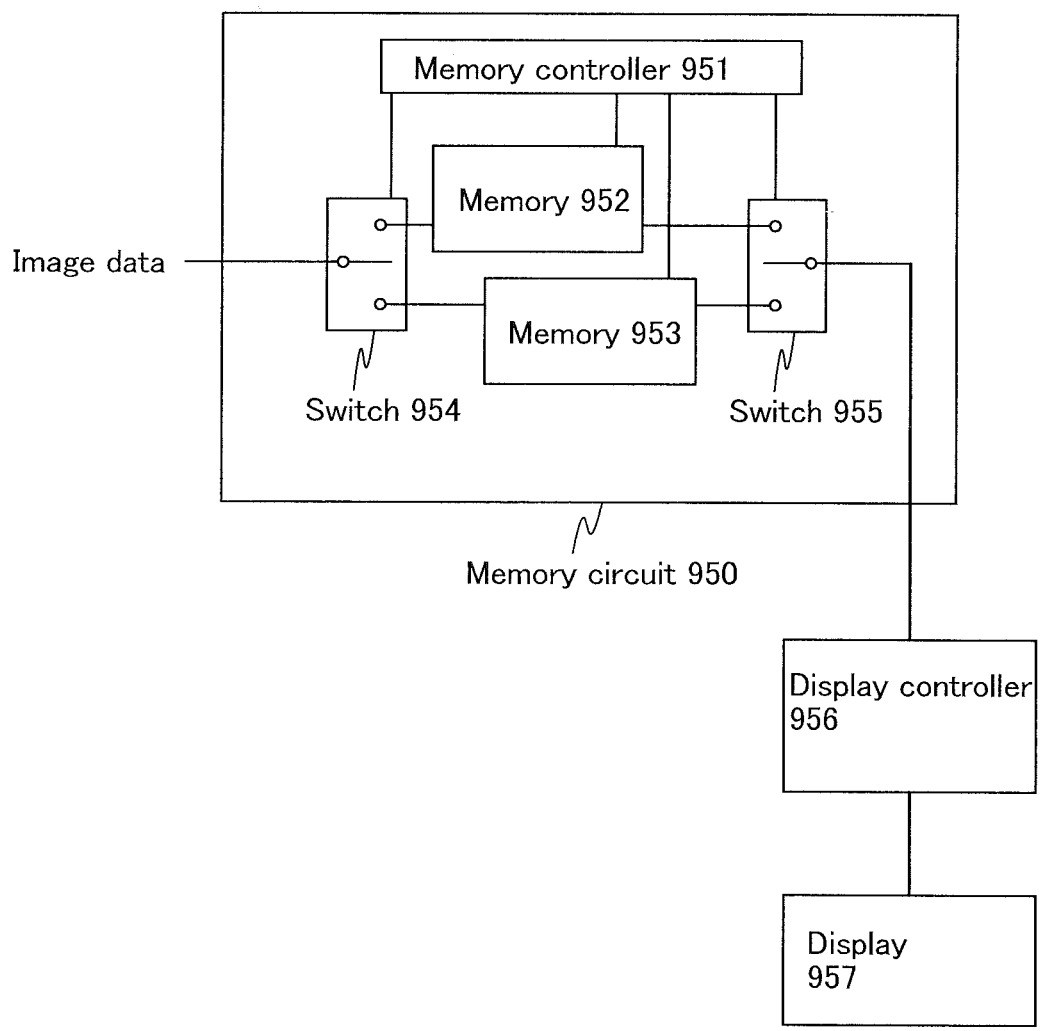
FIG. 13 is a block diagram of a semiconductor device according to one embodiment of the present invention.

FIG. 13 illustrates an example in which any of the semiconductor devices described in the above embodiments is used for a memory circuit 950 in a display. The memory circuit 950 illustrated in FIG. 13 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not necessarily separate memories and a single memory may be divided and used. By employing any of the semiconductor devices described in the above embodiments for the memory 952 and the memory 953, data can be written and read at high speed and held for a long time, and power consumption can be sufficiently reduced. Further, a semiconductor device which is hardly affected by entry of water, moisture, and the like from the outside and has high reliability can be provided.

Figure 14:
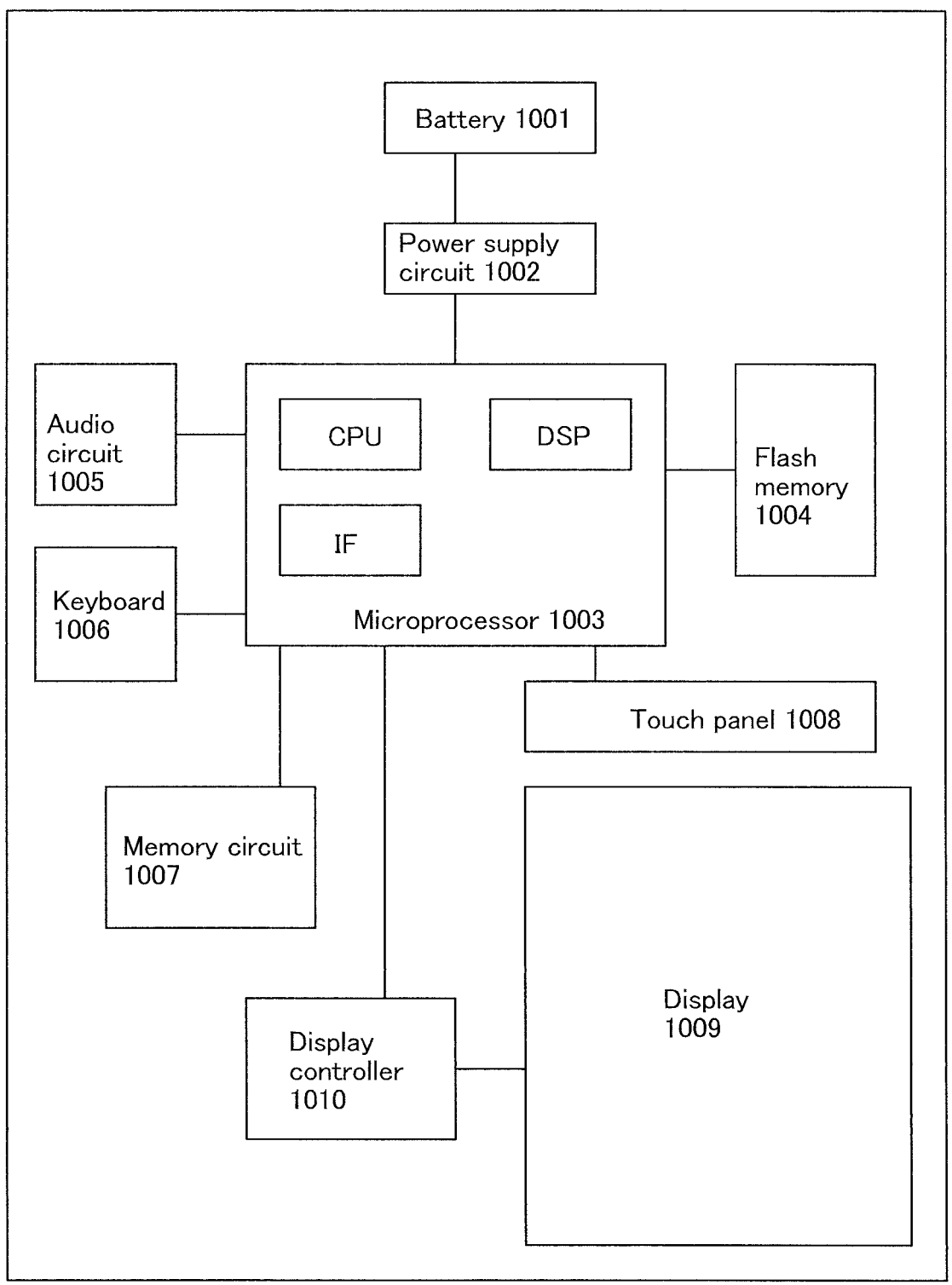
FIG. 14 is a block diagram of a semiconductor device according to one embodiment of the present invention.

FIG. 14 is a block diagram of an electronic book. The electronic book in FIG. 14 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 14. The memory circuit 1007 has a function of temporarily storing the contents of a book. For example, when a user uses a highlight function, the memory circuit 1007 stores and holds data of a portion specified by the user. Note that the highlight function is used to make a difference between a specific portion and the other portions while reading an e-book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing the semiconductor devices described in any of the above embodiments, data can be written and read at high speed and held for a long time, and power consumption can be sufficiently reduced. Further, a semiconductor device which is hardly affected by entry of water, moisture, and the like from the outside and which has high reliability can be provided.

Figure 15A:
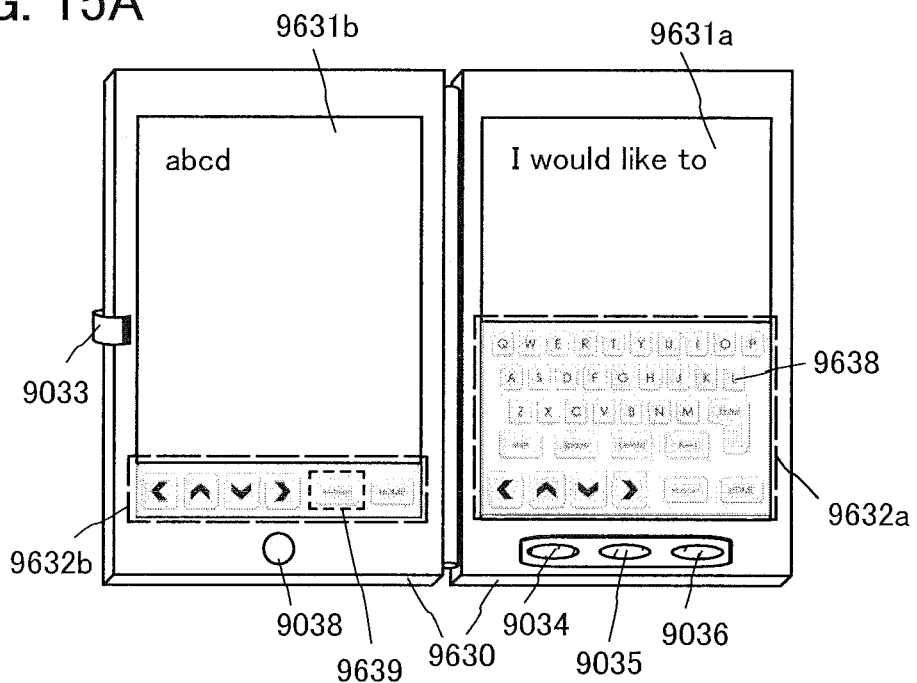
FIGS. 15A to 15C are views illustrating an electronic device according to one embodiment of the present invention.
Figure 15B:
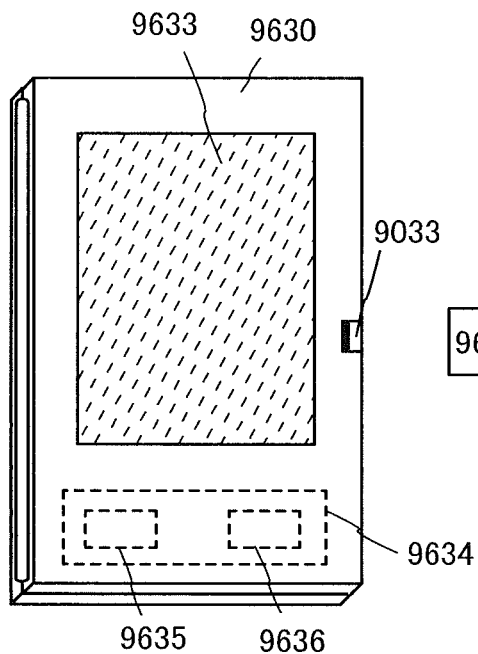
Figure 15C:
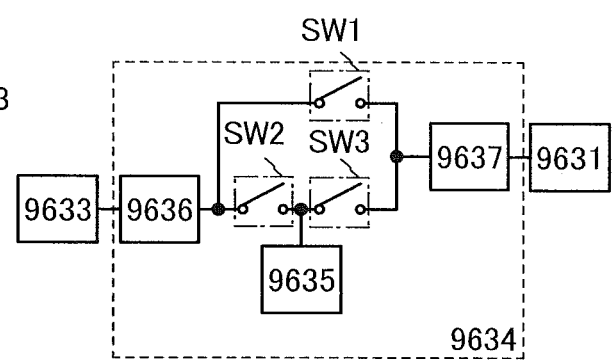

FIGS. 15A to 15C illustrate a specific example of an electronic device. FIGS. 15A and 15B illustrate a foldable tablet terminal. The tablet terminal is opened in FIG. 15A. The tablet terminal includes a housing 9630, a display portion 9631*a*, a display portion 9631*b*, a display mode switch 9034, a power switch 9035, a power saver switch 9036, a clasp 9033, and an operation switch 9038.

The semiconductor device described in Embodiment 1 or 2 can be used for the display portion 9631*a* and the display portion 9631*b*, so that the tablet terminal can have high reliability. In addition, the memory device described in the above embodiment may be applied to the semiconductor device of this embodiment.

Part of the display portion 9631*a* can be a touch panel region 9632*a* and data can be input when a displayed operation key 9638 is touched. Although a structure in which a half region in the display portion 9631*a* has only a display function and the other half region also has a touch panel function is shown as an example, the display portion 9631*a* is not limited to the structure. For example, the display portion 9631*a* can display keyboard buttons in the whole region to be a touch panel, and the display portion 9631*b* can be used as a display screen.

As in the display portion 9631*a*, part of the display portion 9631*b* can be a touch panel region 9632*b*. When a keyboard display switching button 9639 displayed on the touch panel is touched with a finger, a stylus, or the like, a keyboard can be displayed on the display portion 9631*b*.

Touch input can be performed in the touch panel region 9632*a* and the touch panel region 9632*b* at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Although the display portion 9631*a* and the display portion 9631*b* have the same display area in FIG. 15A, one embodiment of the present invention is not limited to this structure. The display portion 9631*a* and the display portion 9631*b* may have different areas or different display quality. For example, one of them may be a display panel that can display higher-definition images than the other.

The tablet terminal is closed in FIG. 15B. The tablet terminal includes the housing 9630, a solar cell 9633, a charge and discharge control circuit 9634, a battery 9635, and a DCDC converter 9636. In FIG. 15B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631*a* and the display portion 9631*b* can be protected; thus, a tablet terminal which has excellent durability and excellent reliability in terms of long-term use can be provided.

In addition, the tablet terminal illustrated in FIGS. 15A and 15B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

The structure and the operation of the charge and discharge control circuit 9634 illustrated in FIG. 15B will be described with reference to a block diagram in FIG. 15C. The solar cell 9633, the battery 9635, the DCDC converter 9636, a converter 9637, switches SW1 to SW3, and a display portion 9631 are illustrated in FIG. 15C, and the battery 9635, the DCDC converter 9636, the converter 9637, and the switches SW1 to SW3 correspond to the charge and discharge control circuit 9634 illustrated in FIG. 15B.

First, an example of the operation in the case where power is generated by the solar cell 9633 using external light is described. The voltage of power generated by the solar cell is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power wirelessly (without contact), or another charging means may be used in combination.

As described above, the semiconductor device in any of the above embodiments is mounted on each of the electronic devices described in this embodiment. Thus, it is possible to obtain an electronic device which is capable of reading data at high speed, storing data for a long time, and reducing power consumption. Further, a semiconductor device which is hardly affected by entry of water, moisture, and the like from the outside and which has high reliability can be provided.

The structures, methods, and the like described in this embodiment can be combined as appropriate with any of the other structures, methods, and the like described in the other embodiments Example 1

In this example, evaluation results of silicon nitride films applicable to a semiconductor device according to one embodiment of the present invention are described. Specifically, results obtained by TDS, SIMS, and RBS are shown.

Methods for manufacturing samples evaluated in this example are described.

As a sample A1, a 300-nm-thick silicon nitride film was deposited over a silicon wafer. The silicon nitride film was deposited as follows. A silicon wafer was placed in a treatment chamber of a plasma CVD apparatus, the pressure in the treatment chamber was controlled so as to be 100 Pa, and a power of 2000 W was supplied from a 27.12 MHz high-frequency power source. Note that the plasma CVD apparatus is a parallel plate plasma CVD apparatus having an electrode area of 6000 cm$^2$, and the power density is $3.2 \times 10^{-1}$ W/cm$^2$. The substrate temperature was set to 350° C. As the supply gas, a mixed gas of silane and nitrogen (SiH$_4$ flow rate: 200 sccm, N$_2$ flow rate: 5000 sccm) was used.

As a sample A2, a 300-nm-thick silicon nitride film was deposited over a silicon wafer. The silicon nitride film was deposited as follows. A silicon wafer was placed in a treatment chamber of a plasma CVD apparatus, the pressure in the treatment chamber was controlled so as to be 100 Pa, and a power of 2000 W (a power density of $3.2 \times 10^{-1}$ W/cm$^2$) was supplied from a 27.12 MHz high-frequency power source. The substrate temperature was set to 350° C. As the supply gas, a mixed gas of silane, nitrogen, and ammonia (SiH$_4$ flow rate: 200 sccm, N$_2$ flow rate: 2000 sccm, NH$_3$ flow rate: 100 sccm) was used.

As a reference sample, a 300-nm-thick silicon nitride film was deposited over a silicon wafer. The silicon nitride film was deposited as follows. A silicon wafer was placed in a treatment chamber of a plasma CVD apparatus, the pressure in the treatment chamber was controlled so as to be 100 Pa, and a power of 2000 W (a power density of $3.2 \times 10^{-1}$ W/cm$^2$) was supplied from a 27.12 MHz high-frequency power source. The substrate temperature was set to 350° C. As the supply gas, a mixed gas of silane, nitrogen, and ammonia (SiH$_4$ flow rate: 200 sccm, N$_2$ flow rate: 2000 sccm, NH$_3$ flow rate: 2000 sccm) was used.

The sample A1 and the sample A2 each are a silicon nitride film deposited under a condition that the flow ratio of ammonia to nitrogen in the supply gas is less than or equal to 0.1, which is a condition suitable for a silicon nitride film used for a semiconductor device according to one embodiment of the present invention. On the other hand, the reference sample is a silicon nitride film deposited under a condition which is not suitable for the silicon nitride film used for a semiconductor device according to one embodiment of the present invention.

Figure 16:
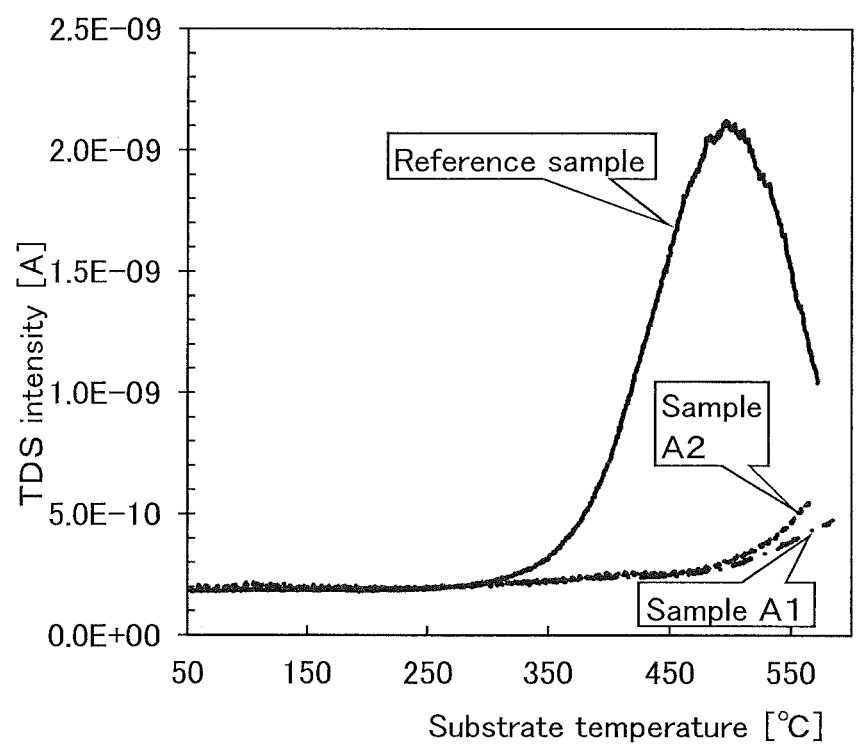
FIG. 16 shows TDS results in Example 1.

The samples A1 and A2 and the reference sample were subjected to TDS measurement. FIG. 16 shows the number of released hydrogen molecules of each of the samples with respect to substrate temperature. In FIG. 16, the horizontal axis indicates substrate temperature and the vertical axis indicates TDS intensity corresponding to the number of released hydrogen molecules.

A peak of a curve showing TDS results is a peak which is attributed to release of atoms or molecules contained in an analyzed sample (the samples A1 and A2 and the reference sample in this example) to the outside. The total amount of the atoms or molecules released to the outside is proportional to the integral value of each curve. Thus, the total amounts of the atoms or molecules contained in the silicon nitride films can be compared based on the height of the peak intensity. In this example, the number of released hydrogen molecules in the range from 50° C. to 570° C. was obtained as a quantitative value.

It is found from FIG. 16 that hydrogen molecules in the reference sample start to be released by heat treatment at a substrate temperature around 350° C. and a peak of the number of released hydrogen molecules in the reference sample appears at around 500° C. On the other hand, in each of the samples A1 and A2, a peak of the number of released hydrogen molecules does not appear at a temperature lower than or equal to 500° C.

The quantitative values of the number of released hydrogen molecules in the sample A1, the sample A2, and the reference sample were $7.35 \times 10^{19}/cm^3$, $9.00 \times 10^{19}/cm^3$, and $7.75 \times 10^{20}/cm^3$, respectively.

Figure 17A:
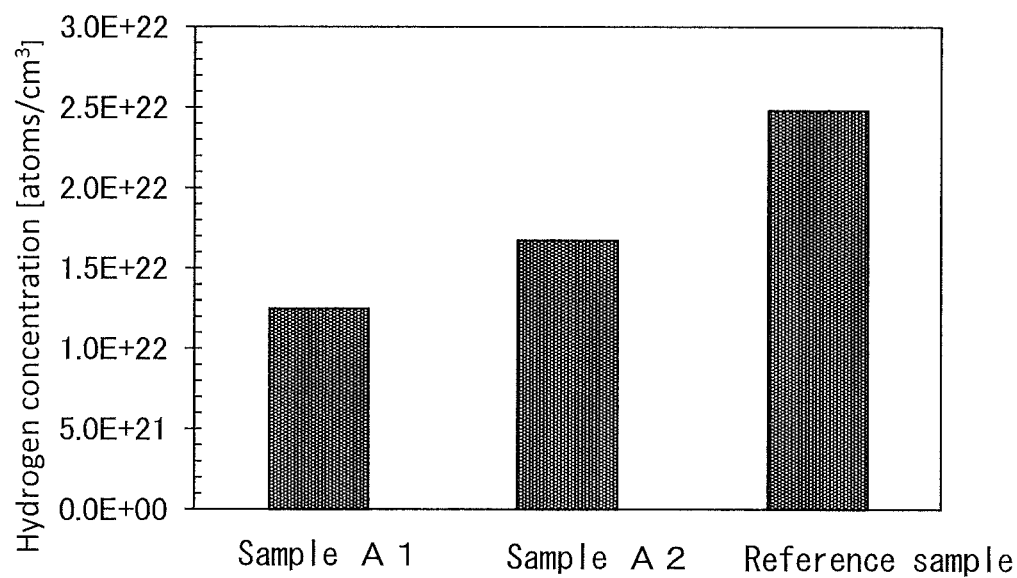
FIGS. 17A and 17B show SIMS analysis results and RBS analysis results in Example 1.

Next, SIMS measurement was performed on the samples A1 and A2 and the reference sample to measure the hydrogen concentrations in the silicon nitride films. FIG. 17A shows SIMS results.

The hydrogen concentrations in the sample A1, the sample A2, and the reference sample were $1.25 \times 10^{22}$ atoms/$cm^3$, $1.67 \times 10^{22}$ atoms/$cm^3$, and $2.48 \times 10^{22}$ atoms/$cm^3$, respectively. Thus, it is confirmed that the hydrogen concentration in each of the samples A1 and A2 is lower than that in the reference sample.

Figure 17B:
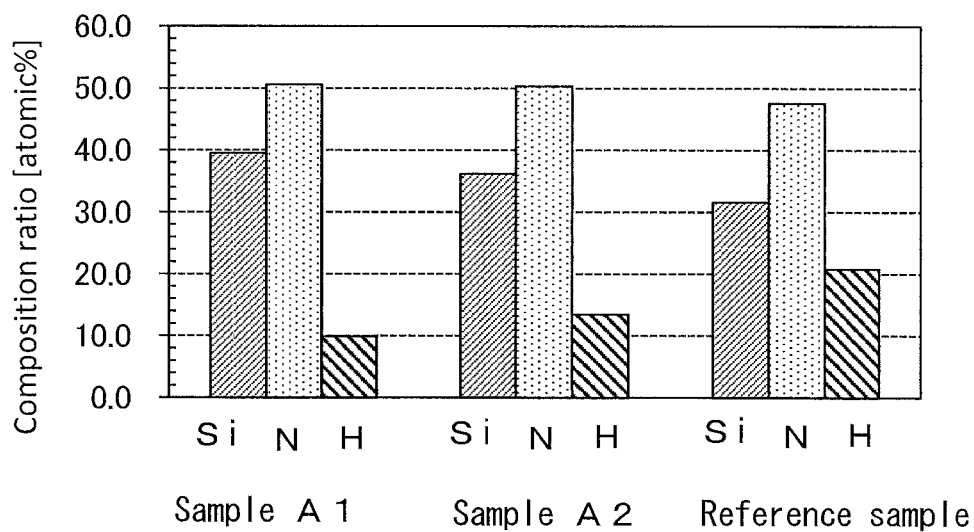

Next, the compositions of the samples A1 and A2 and the reference sample were measured using RBS. FIG. 17B shows quantitative values obtained by RBS analysis.

The vertical axis of FIG. 17B indicates values of the proportions (atomic %) of silicon (Si), nitrogen (N), and hydrogen (H) contained in each sample. The following was found from the measurement. In the sample A1, silicon, nitrogen, and hydrogen are contained at 39.5 atomic %, 50.6 atomic %, and 9.9 atomic %, respectively. In the sample A2, silicon, nitrogen, and hydrogen are contained at 36.2 atomic %, 50.3 atomic %, and 13.5 atomic %, respectively. In the reference sample, silicon, nitrogen, and hydrogen are contained at 31.6 atomic %, 47.6 atomic %, and 20.8 atomic %, respectively. Thus, it is confirmed that the proportion of hydrogen of each of the samples A1 and A2 is lower than that in the proportion of the reference sample.

The film formed in this example has a small number of released hydrogen molecules and low hydrogen concentration. Therefore, the film is suitable for a film applied to a semiconductor device according to one embodiment of the present invention.

Example 2

In this example, a property of blocking hydrogen of a silicon nitride film used for a semiconductor device according to one embodiment of the present invention is evaluated. As the evaluation method, TDS was used.

First, a silicon nitride film B1 was deposited to a thickness of 275 nm over a silicon wafer. The silicon nitride film B1 was deposited using the same conditions as the reference sample described in Example 1.

Figure 18A:
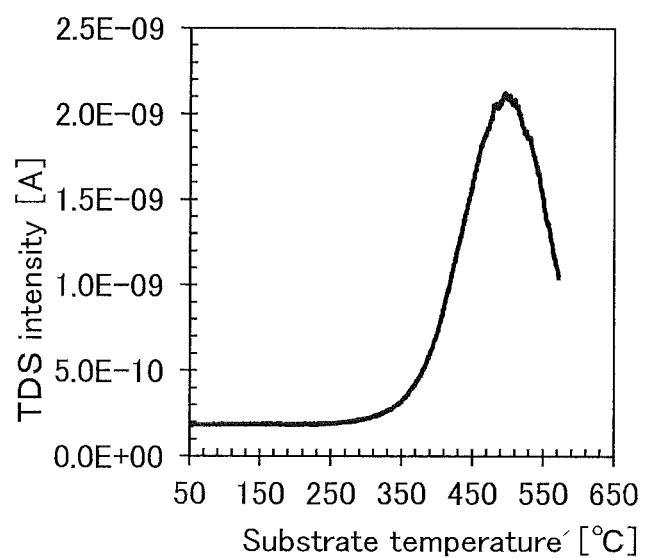
FIGS. 18A and 18B show TDS results in Example 2.

FIG. 18A shows TDS results of the silicon nitride film B1. In FIG. 18A, the horizontal axis indicates substrate temperature and the vertical axis indicates the number of released hydrogen molecules with respect to the substrate temperature. Hydrogen molecules in the silicon nitride film B1 start to be released at around 350° C. by heating during TDS and a peak of the number of released hydrogen molecules in the silicon nitride film B1 appears at around 500° C. The quantitative value of the number of released hydrogen molecules in the TDS shown in FIG. 18A is $7.75 \times 10^{20}/cm^3$.

Next, a silicon nitride film B2 applicable to a semiconductor device according to one embodiment of the present invention was deposited to a thickness of 50 nm as described in Example 1 to be stacked over the silicon nitride film B1, whereby a sample C was manufactured. The silicon nitride film B2 was formed using the same conditions as the silicon nitride film used for the sample A1 described in Example 1.

Figure 18B:
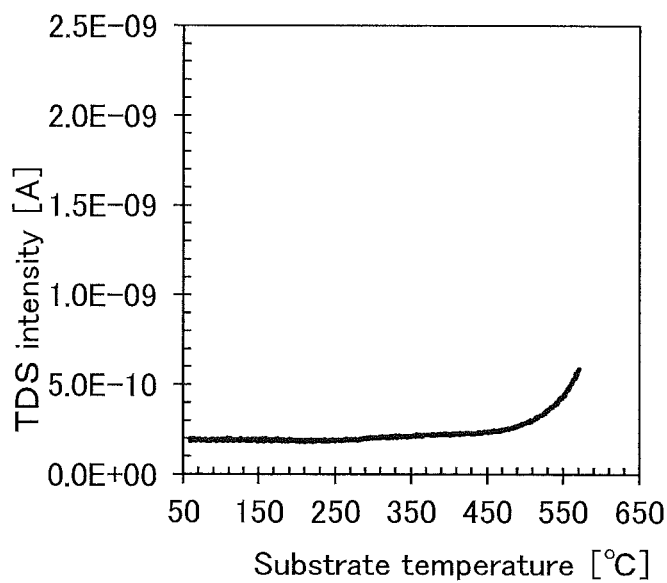

FIG. 18B shows the number of released hydrogen molecules with respect to substrate temperature in the sample C.

As shown in FIG. 18B, in the sample C, a peak of the number of released hydrogen molecules does not appear at a temperature lower than or equal to 550° C. Further, the quantitative value of the number of released hydrogen molecules of the sample C is $1.10 \times 10^{20}/cm^3$. Thus, it is confirmed that release of hydrogen molecules, which is observed in the case of the silicon nitride film B1 alone, can be suppressed by stacking the silicon nitride film B2 used for a semiconductor device according to one embodiment of the present invention over the silicon nitride film B1.

As a result, it is confirmed that the silicon nitride film applicable to a semiconductor device according to one embodiment of the present invention has a property of blocking hydrogen.

This application is based on Japanese Patent Application serial no. 2012-147633 filed with Japan Patent Office on Jun. 29, 2012, the entire contents of which are hereby incorporated by reference.

What is claimed is:

1. A method for manufacturing a semiconductor device comprising the steps of:
    forming a gate electrode layer over an oxide semiconductor film with a gate insulating film therebetween; and
    forming a silicon nitride film over the oxide semiconductor film, the gate insulating film, and the gate electrode layer so that the silicon nitride film is in contact with a first region of the oxide semiconductor film and nitrogen is added to the first region during the forming of the silicon nitride film,
    wherein the oxide semiconductor film comprises a crystal,
    wherein the silicon nitride film is formed by using a deposition gas comprising silane, nitrogen, and ammonia, and
    wherein a flow ratio of ammonia to nitrogen in the deposition gas is less than or equal to 0.02.

2. The method for manufacturing a semiconductor device according to claim 1,
    wherein the first region is a low-resistance region and is adjacent to a channel formation region of the oxide semiconductor film.

3. The method for manufacturing a semiconductor device according to claim 1, further comprising the step of adding phosphorus or boron to the oxide semiconductor film with the gate electrode layer used as a mask after the gate electrode layer is formed.

4. The method for manufacturing a semiconductor device according to claim 1, further comprising the step of performing heat treatment after the silicon nitride film is formed.

5. A method for manufacturing a semiconductor device comprising the steps of:
    forming an oxide semiconductor film;
    forming an insulating film over the oxide semiconductor film;
    forming a gate electrode layer over the insulating film;
    forming a gate insulating film by etching the insulating film using the gate electrode layer as a mask; and
    forming a silicon nitride film over the oxide semiconductor film, the gate insulating film, and the gate electrode layer so that the silicon nitride film is in contact with a first region of the oxide semiconductor film and nitrogen is added to the first region during the forming of the silicon nitride film, wherein the silicon nitride film is formed by using a deposition gas comprising silane, nitrogen, and ammonia, and wherein a flow ratio of ammonia to nitrogen in the deposition gas is less than or equal to 0.02.

6. The method for manufacturing a semiconductor device according to claim 5, wherein the first region is a low-resistance region and is adjacent to a channel formation region of the oxide semiconductor film.

7. The method for manufacturing a semiconductor device according to claim 5, further comprising the step of adding phosphorus or boron to the oxide semiconductor film with the gate electrode layer used as a mask after the gate electrode layer is formed.

8. The method for manufacturing a semiconductor device according to claim 5, further comprising the step of performing heat treatment after the silicon nitride film is formed.

9. The method for manufacturing a semiconductor device according to claim 1, further comprising the steps of:

forming a first opening and a second opening in the silicon nitride film; and forming a first electrode layer and a second electrode layer over the oxide semiconductor film and the silicon nitride film.

* * * * *